(12) United States Patent
Shigeta

(10) Patent No.: US 6,301,685 B1
(45) Date of Patent: Oct. 9, 2001

(54) ERROR PROPAGATION PATH EXTRACTION SYSTEM, ERROR PROPAGATION PATH EXTRACTION METHOD, AND RECORDING MEDIUM RECORDING ERROR PROPAGATION PATH EXTRACTION CONTROL PROGRAM

(75) Inventor: Kazuki Shigeta, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/195,548

(22) Filed: Nov. 19, 1998

(30) Foreign Application Priority Data

Nov. 19, 1997 (JP) .................................................. 9-317557

(51) Int. Cl.⁷ ............................. G06F 11/10; H03M 13/00
(52) U.S. Cl. .............................. 714/799; 714/25; 714/824
(58) Field of Search ............................. 714/3, 4, 30, 45, 714/801, 25, 799, 819, 824

(56) References Cited

U.S. PATENT DOCUMENTS

| 4,633,467 | * | 12/1986 | Abel et al. ............................. 714/45 |
| 5,383,201 | * | 1/1995 | Satterlee et al. ......................... 714/4 |

FOREIGN PATENT DOCUMENTS

| 61-241672 | 10/1986 | (JP) . |
| 1-156680 | 6/1989 | (JP) . |
| 2-19782 | 1/1990 | (JP) . |
| 4-55776 | 2/1992 | (JP) . |
| 8-94714 | 4/1996 | (JP) . |
| 8-146093 | 6/1996 | (JP) . |

OTHER PUBLICATIONS

Miron Abramovici et al., "Digital Systems Testing and Testable Design", pp. 187–197, *IEEE Press*, The Institute of Electrical and Electronics Engineers, Inc., New York, 1990.

* cited by examiner

*Primary Examiner*—Emmanuel L. Moise
(74) *Attorney, Agent, or Firm*—Young & Thompson

(57) ABSTRACT

To realize high-speed error propagation path extraction in a combinational circuit, a logical contradiction judgment section detects the logical state of each signal line under the implication by a first implication section and judges whether the logical state of every signal line is estimated as "0," "1," or "X" unless a contradiction is detected. When it is judged that logical state estimation is not completed, a U(Unknown)-state retrieval section retrieves an Unknown-state signal line whose logical state is incomplete and retrieves a signal line connected to an error propagation path through a gate. A detected signal line is decided as "0," a decision level showing a decision frequency is increased by 1, and implication is restarted by a first implication section. It is judged that logical state estimation is completed, a failing output terminal connection related line extraction section extracts an error propagation path directly influencing a failing output terminal and outputs the route to an output unit.

12 Claims, 15 Drawing Sheets

PRIOR ART

PRIOR ART

PRIOR ART

PRIOR ART

PRIOR ART

ERROR PROPAGATION PATH EXTRACTION SYSTEM, ERROR PROPAGATION PATH EXTRACTION METHOD, AND RECORDING MEDIUM RECORDING ERROR PROPAGATION PATH EXTRACTION CONTROL PROGRAM

BACKGROUND OF THE INVENTION

1. Field of the Invention

The present invention relates to an error propagation path extraction system, error propagation path extraction method, and a recording medium recording error propagation path extraction control program, particularly to an error propagation path extraction system for quickly obtaining a signal line in which a fault may propagate in a combinational logic circuit.

2. Description of the Related Art

In the case of a conventional error propagation path extraction system, there is a system for extracting a route in which an error may propagate in a circuit when an input/output logical state obtained by inputting a test pattern is different from a normal output expected for a normal circuit. As disclosed in the official gazette of Japanese Patent Application Laid-Open No. 8-146093, this system can be used as a part of a fault diagnosis system of a sequential circuit. In this case, a fault can be present in the combinational circuit or an error can be included in an input pattern.

As the above error propagation path extraction system, there is a inverse logical inference system using a back track system introducing Don't Care. This inverse logical inference system is a system for estimating the logical state of the input terminal of a combinational logic circuit from the logical state of the output terminal of the circuit.

When using the fault diagnosis system for the fault analysis of a 100K-gate-size sequential circuit, a combinational circuit to be extracted is estimated as a 10K-gate size and the capacity for estimating every input signal pattern of the same-size combinational circuit is necessary.

In this case, a back track system is a system for estimating the logical state of every signal line by repeating implication and decision, which is also referred to as a "branch-and-bound system."

Because the back track system uses only a small number of memories, in which the number of data values is proportional to the number of gates, it has features that it is possible to easily estimate the number of memories used, the algorithm is simple, and parallel processing is easy. In the case of the back track system, however, when a circuit size increases, the decision frequency increases. Therefore, a lot of calculation time is required to obtain every input logical state.

By applying the back track system to inverse logical inference, it is possible to estimate the internal logical state of a logic circuit. The back track system is described in "M. Abramobvici, M. A. Breuer, and A. D. Friedman, Digital Systems Testing and Testable Design, IEEE Press, New York, pp. 186–196, 1990."

The above error propagation path extraction system is a method for comparing the input estimated state obtained through inverse logical inference and the logical state in a combinational logic circuit obtained in the process of the inverse logical inference with a normal logical value previously obtained through logical simulation in a normal circuit, recognizing a signal line under a faulty state, and extracting an error propagation path. This method makes it possible to obtain every input logical state meeting an output logical state and every internal logical state of a circuit and extract an error propagation path by comparing the states with a normal logical value.

However, it is estimated that the decision frequency greatly increases and the calculation time increases in the case of a multiplier. Moreover, as a circuit increases in size, the number of input logical states becomes tremendous. If an error propagation path is extracted from these tremendous logical states, a route not influencing a fault output is also extracted. In this case, a route not influencing a fault output denotes a route not propagating a fault to a fault output even if the fault occurs on the route though a logical state does not coincide with a normal logical value.

Moreover, to obtain an input logical state meeting an output logical state, it is assumed that a combinational circuit is normal. Therefore, it is impossible to extract an error propagation path for a fault due to the inside of the combinational circuit.

An embodiment of the prior art is described below in detail by referring to the accompanying drawings. In FIG. 10, the embodiment of the prior art includes an input unit 1 such as a keyboard, a data processor 2 operated in accordance with program control, a memory 4 for storing information, and an output unit 5 such as a display or printer.

The memory 4 is provided with a logic-circuit-structure storage section 41, a decision-state storage section 42, and a logical-state storage section 43. The logic-circuit-structure storage section 41 previously stores the structure of a logic circuit, that is, the type of gate, connective relation between gates, connective relation between gate and signal line, and connective relation between signal lines.

The decision-state storage section 42 stores a decision level showing the number of decisions performed and a decision level when the logical state of each signal line is estimated through implication. The logical-state storage section 43 stores the logical state of each signal line under processing and the logical state (normal logical value) of each signal line when a circuit is normal.

The data processor 2 is provided with an initialization section 21, an X(Don't Care) state (hereafter referred to as X state) setting section 22, a first implication section 23, a logical contradiction judgment section 24, a processing-completion judgment section 25, a back-track section 26, U(Unknown)-state (hereafter referred to as U state) retrieval section 27, logical-value decision section 29, and logical-value comparison section 30.

The initialization section 21 sets the type of a logic circuit supplied from the input unit 1 and the logical state of an input/output terminal. The X-state setting section 22 refers to a logic circuit structure stored in the logic-circuit-structure storage section 41 and the logical state of each signal line stored in the logical-state storage section 43, sets the initial logical state of each signal line whose logical state is not fixed to X state, and records the X state in the logical-state storage section 43. In this case, the X state is a logical state representing to allow both logical states "0" and "1" when both logical states "0" and "1" of a signal line do not contradict the logical state of the entire logic circuit.

As shown in FIG. 11, the first implication section 23 includes an implication section 231, logical contradiction detection section 232, a first-implication-allowing-gate retrieval section 233, and an implication-completion judgment section 234.

The implication section 231 refers to a logic circuit structure stored in the logic-circuit-structure storage section 41 and the logical state of each signal line stored in the logical-state storage section 43 and estimates the logical state of an input/output line at an input/output line set by the initialization section 21, a gate connected to a signal line decided by the logical-value decision section 29, or a gate detected by the first implication-allowing-gate retrieval section 233. Estimation of a logical state is performed by using "0," "1," and "X."

When a new logical value is estimated, the implication section 231 records the logical value in the logical-state storage section 43 and moreover, records a decision level showing under what number of decisions the estimation is performed in the decision-state storage section 42.

The logical-contradiction detection section 232 refers to a logic circuit structure stored in the logic-circuit-structure storage section 41 and the logical state of each signal line stored in the logical-state storage section 43 and detects a contradiction between a new logical state decided by the implication section 231 and a logical state having been decided by that point of time if any.

The first implication-allowing-gate retrieval section 233 refers to a logic circuit structure stored in the logic-circuit-structure storage section 41 and the logical state of each signal line stored in the logical-state storage section 43 and retrieves an implication-allowing gate. The implication-enable gate is a gate capable of implicating and deciding the logical state of an input/output line which is connected to a gate and whose logical state is not decided yet in accordance with the function of the gate and the logical state of an input/output line which is connected to the gate and whose logical state is already decided as "0" or "1."

The implication-completion judgment section 234 judges that every implication is completed and completes the processing of the first implication section 23 when a gate for implication is not detected by the first implication-allowing-gate retrieval section 233.

The logical-contradiction judgment section 24 detects whether a contradiction occurs in the logical state of a signal line in the first implication section 23. The processing-completion judgment section 25 refers to the logical state of each signal line stored in the logical-state storage section 43 and judges whether the logical state of every signal line is estimated.

The back-track section 26 refers to a decision state stored in the decision-state storage section 42 and the logical state of a signal line stored in the logical-state storage section 43, erases a logical state at a decision level whose processing is already completed, and returns the logical state of each signal line to the logical state before decision is performed. The U-state retrieval section 27 checks the logical state of input/output of the gate in the combinational circuit and retrieves a signal line whose logical state is incomplete and which is under an Unknown state.

The logical-value decision section 29 decides the logical state of a signal line whose logical value detected by the U-state retrieval section 27 is an indefinite "U" state. The logical-value comparison section 30 compares the obtained logical state of each signal line with a normal logical value showing the logical state of each signal line obtained through logical simulation by a normal circuit, extracts an error propagation path, and outputs the data for the route to the output unit 5.

Then, operations of the embodiment of the prior art are described below by referring to FIGS. 10 to 14. The logical state "U (Unknown)" denotes an indefinite state in which the logical state of a signal line cannot be decided as "0" or "1."

However, the logical state "X (Don't Care)" denotes a logical state allowing both logical states "0" and "1" of a signal line when the both logical states "0" and "1" of the signal line don not contradict the logical state of the entire logic circuit.

The logical state of an input/output terminal supplied from the input unit 1 is set by the initialization section 21 to initialize a decision level (dlevel) showing the decision frequency (steps S51 and S52 in FIG. 12). The state "X" is set to a signal line whose logical state is not estimated as the initial state for implication. The result is stored in the logical state storage section 43 (step S53 in FIG. 12).

Then, implication is performed by the first implication section 23 (step S54 in FIG. 12). The implication is an operation for estimating the logical state of an input/output line of a gate not estimated yet in accordance with the logical state of the input/output line of a gate already estimated at each gate.

First, the implication section 231 (step S71 in FIG. 13) estimates the logical state of an input/output line through implication at a detected gate. The logical state of an input/output line is estimated at an input/output line set through initialization (step S51 in FIG. 12), a gate connected to a signal line decided by logical-value decision section 29, or a gate detected by the first implication-allowing-gate retrieval section 233. The estimated logical state is recorded together with the decision level at that point of time. FIG. 14 shows an example of implication in the case of a two-input NAND gate.

The logical-contradiction detection section 232 detects whether a contradiction occurs in a newly-decided logical state. When the section 232 detects a contradiction, it completes implication (step S72 in FIG. 13). When a logical contradiction is not detected in step S72, the first implication-allowing-gate retrieval section 233 (step S73 in FIG. 13) retrieves other implication-allowing gate.

Then, the implication-completion judgment section 234 judges whether every implication is completed. When a gate is detected in step S73, the section 234 judges in step S74 that implication is not completed yet. When a gate is not detected in step S73, the section 234 judges in step S74 that implication is completed and completes first implication.

The logical-contradiction judgment section 24 detects the contradiction of the logical state of each signal line under implication (step S55 in FIG. 12). Unless a contradiction is detected by the logical-contradiction judgment section 24, the processing-completion judgment section 25 refers to the logical state of a signal line stored in the logical-state storage section 43 and judges whether the logical state of every signal line is estimated as "0," "1," or "X" (step S56 in FIG. 12).

The section 25 judges in step S56 that logical state estimation of every signal line is not completed, the U-state retrieval section 27 checks the logical state of input/output of the gate in the combinational circuit and retrieves an Unknown-state signal line whose logical state is incomplete (step S57 in FIG. 12). A detected signal line is decided as "0," a decision level (dlevel) showing the decision frequency is increased by 1 (step S58 in FIG. 12), and implication is restarted by the first implication section 23 (step S54 in FIG. 12).

When it is decided by the processing-completion judgment section 25 that the logical state of every signal line is estimated, the logical-value comparison section 30 (step S59 in FIG. 12) extracts a signal line having a state different from a normal logical value, that is, an error propagation path because the logical state in a circuit is decided as "0," "1," or "X."

Then, the section 25 judges whether decision processings for both "0" and "1" are completed for every decided line (step S60 in FIG. 12). When it is judged in step S60 that the logical state of every signal line is estimated, the logical state of a signal line in the combinational circuit is estimated as "0," "1," or "X." Also when a contradiction is detected by the logical-contradiction judgment section 24, the judgment processing in step S60 is performed.

When the processing-completion judgment section 25 (step S60 in FIG. 12) judges that decision processing is not completed, the back track section 26 retrieves the state "1" and a decision line not decided and having the highest decision level, initializes the detected decision line to the state "U" showing that the logical state of a signal line estimated at a decision level equal to or higher than the decision level of the detected signal line is under an indefinite state, and returns the logical state of each signal line to the logical state before the decision is performed (step S61 in FIG. 12).

The logical-value decision means 29 decides the state of the decision line detected by the back-track means 26 as "1" (step S62 in FIG. 12) and returns to the implication processing by the first implication section 23 (step S54 in FIG. 12). When it is judged by the processing-completion judgment section 25 (step S60 in FIG. 12) that decision processing is completed, error propagation path extraction processing is completed.

FIG. 15 shows a decision tree structure when applying an error propagation path extraction system of the prior art to the ISCAS'-85 (The 1985 IEEE International Symposium on Circuits and Systems) benchmark circuit C17 (see FIG. 3). In FIG. 15, the logical state (output vector) of an output terminal is assumed as line 22 (122)=1 and line 23 (123)=1.

A decision tree structure shows a signal line number for a node (numeral enclosed by a circle; 1, 3, 10, or 16 in FIG. 15) to perform decision and a branch (continuous line connecting nodes) shows a decided logical state. In the case of FIG. 15, by performing decisions of both "0" and "1" for a total of four signal lines eight times, five internal logical states meeting the logical state of the output terminal are obtained and an error propagation path is obtained by comparing each state with a normal logical value.

In FIG. 15, logical states of the signal lines shown by rectangular frames are shown in the sequence of line 1, line 2, line 3, line 6, line 7, line 10, line 11, line 16, line 19, line 22, and line 23. Moreover, an underlined logical state shows an error propagation path different from a normal logical value.

In this case, from the circuit diagram in FIG. 3, it is found that line 1 (11) and line 10 (110), when a fault occurs on the signal lines, have no possibility of propagating the fault to line 23 (123).

As the result of comparing five obtained logical states, (1110X010X11) and (0110X110X11) are different from each other in the logical states of line 1 and line 10 and (010XX110X11) and (110XX110X11) are different from each other only in the error of line 1 and redundant data including line 1 and line 10 having no possibility of propagating an error to a failing output terminal is output.

As other error propagation path extraction method, there is a fault dictionary method of comparing a fault dictionary previously obtained through a fault simulation with a test result and estimating a fault portion. However, preparation of a fault dictionary requires a fault simulation requiring a long calculation time and moreover, the dictionary size increases as a circuit size increases. Therefore, it is general that the type of fault is restricted to a single fault.

The art disclosed in the official gazette of Japanese Patent Application Laid-Open No. 1-244384 shows an apparatus for specifying a fault portion by following an error propagation path while measuring the logical state of a signal line from a failing output terminal in accordance with physical analysis means such as an EB (electron beam) tester.

Recently, however, an LSI (large scale integrated circuit) chip has been decreased in size and wiring has been formed to be a multilayer. Therefore, it is difficult to measure the logical state in a circuit with physical means and thus physically follow an error propagation path.

In the case of the above conventional error propagation path extraction method, the computational complexity increases and thereby, the computational time increases because decision and implication are executed also for a signal line not connected with an error propagation path.

Because it is the original object of test pattern generation to obtain an input pattern allowing an error assumed in a circuit to propagate to an output terminal and be detected, the test pattern generation is optimized so as to obtain one input pattern at a high speed. Therefore, to obtain every error propagation path meeting an output logical state, a lot of computational time is required and similarly to the case of the above prior art, it is difficult to extract only an error propagation path influencing a failing output terminal and thus, the amount of output data greatly increases.

Moreover, because an error propagation path having no possibility of propagating an error is output to a fault output, the amount of data to be output greatly increases. Furthermore, because an input logical state meeting an output logical state is obtained by using the inverse logical inference system and assuming a combinational circuit to be normal and thereafter, an error propagation path is output, it is impossible to extract an error propagation path due to a fault in the combinational circuit.

SUMMARY OF THE INVENTION

Therefore, it is an object of the present invention to solve the above problems and provide an error propagation path extraction system capable of extracting an error propagation path due to a fault in a combinational circuit, an error propagation path extraction method, and a recording medium recording an error propagation path extraction control program.

It is another object of the present invention to provide an error propagation path extraction system capable of extracting an error propagation path due to a fault in a combinational circuit, an error propagation path extraction method, and an error propagation path extraction control program.

An error propagation path extraction system of the present invention is an error propagation path extraction system for extracting an error propagation path in accordance with the inverse logical inference system for estimating the logical state of the input terminal of a combinational logic circuit in accordance with the logical state of the output terminal of the logic circuit by using the back track system for estimating the logical state of every signal line by repeating implication and logical state decision for estimating the logical state of the input/output line of a gate not estimated yet in accordance with the logical state of the input/output line of a gate already estimated, comprising:

error propagation path influenced line retrieval means for retrieving a signal line connected with the error propagation path as a signal line for deciding the logical state; and failing output terminal connection related line extraction means for extracting a signal line having a possibility of propagating an error to a failing output terminal from the error propagation path in accordance with the retrieval result of the fault propagation influenced line retrieval means.

Another error propagation path extraction system of the present invention comprises implication means for executing the implication while confirming whether a contradiction occurs between the logical state estimated by the implication and a logical state estimated by the point of time in addition to the above structure.

An error propagation path extraction method of the present invention is an error propagation path extraction method for extracting an error propagation path in accordance with the inverse logical inference system for estimating the logical state of the input terminal of a combinational logic circuit in accordance with the logical state of the output terminal of the logic circuit by using the back track system for estimating the logical state of every signal line by repeating implication and logical state decision for estimating the logical state of the input/output line of a gate not estimated yet in accordance with the logical state of the input/output line of a gate already estimated, comprising the steps of:

retrieving a signal line connected with the error propagation path as a signal line for deciding the logical state; and extracting a signal line having a possibility of propagating an error to a failing output terminal from the error propagation path in accordance with the retrieval result of the fault propagation influenced line retrieval means.

Another error propagation path extraction means of the present invention comprises the step of executing the implication while confirming whether a contradiction occurs between the logical state estimated by the implication and a logical state estimated by the point of time in addition to the above structure.

A recording medium of the present invention recording an error propagation path extraction control program is a recording medium recording an error propagation path extraction control program for extracting an error propagation path in accordance with the inverse logical inference system for estimating the logical state of the input terminal of a combinational logic circuit in accordance with the logical state of the output terminal of the combinational logic circuit by using the back track system for estimating the logical state of every signal line by repeating implication and logical state decision for estimating the logical state of the input/output line of a gate not estimated yet in accordance with the logical state of the input/output line of a gate already estimated, wherein the error propagation path extraction control program makes control means for controlling extraction of the error propagation path retrieve the signal line connected with the error propagation path as a signal line for deciding the logical state and extract a signal line having a possibility of propagating an error to a failing output terminal from the error propagation path in accordance with the retrieval result of the error propagation path influenced line retrieval means.

A recording medium of the present invention recording another fault propagation extraction control program makes the control means execute the implication while confirming whether a contradiction occurs between the logical state estimated through the implication and the logical state estimated by the point of time.

That is, the first fault portion extraction system of the present invention decides a logical value only for a signal line connected to an error propagation path and extracts only an error propagation path having a possibility of propagating an error to a failing output terminal.

More specifically, the first fault portion extraction system comprises error propagation path influenced line retrieval means for retrieving a signal line connected to an error propagation path when retrieving a signal line whose logical state is set to "U (Unknown)" and which is an object for decision and failing output terminal connection related line extraction means for extracting a signal line having a possibility of propagating an error to a failing output terminal by checking the physical relation between a route and a failing output terminal in accordance with the extracted error propagation path.

Moreover, the second fault portion extraction system of the present invention executes implication while confirming whether a contradiction occurs between the logical state estimated through implication and the logical state estimated by the point of time and stores the data when a contradiction is detected under implication.

More specifically, the second fault portion extraction system has second implication means for executing implication while confirming whether a contradiction occurs between the logical state estimated through implication and the logical state estimated by the point of time.

The error propagation path influenced line retrieval means restricts signal lines to be decided to only the signal lines connected to an error propagation path. The failing output terminal connection related line extraction means extracts a signal line having a possibility of propagating an error to a failing output terminal from an extracted error propagation path. The second implication means performs implication while confirming whether a contradiction occurs between the logical state of an implication start line and the logical state decided by the point of time.

Thereby, a fault portion extraction system of the present invention makes it possible to obtain a high-speed error propagation path extraction algorithm or a inverse logical inference algorithm for outputting only an error propagation path having a possibility of propagating an error to a failing output terminal and extract an error propagation path due to a fault in a combinational circuit.

In this case, it is theoretically possible to estimate an error propagation path without using physical analysis means and expect an advantage for a future fined LSI having multilayer wiring. Moreover, it is possible to use a test-pattern generation system.

DESCRIPTION OF THE PREFERRED EMBODIMENTS

Figure 1:
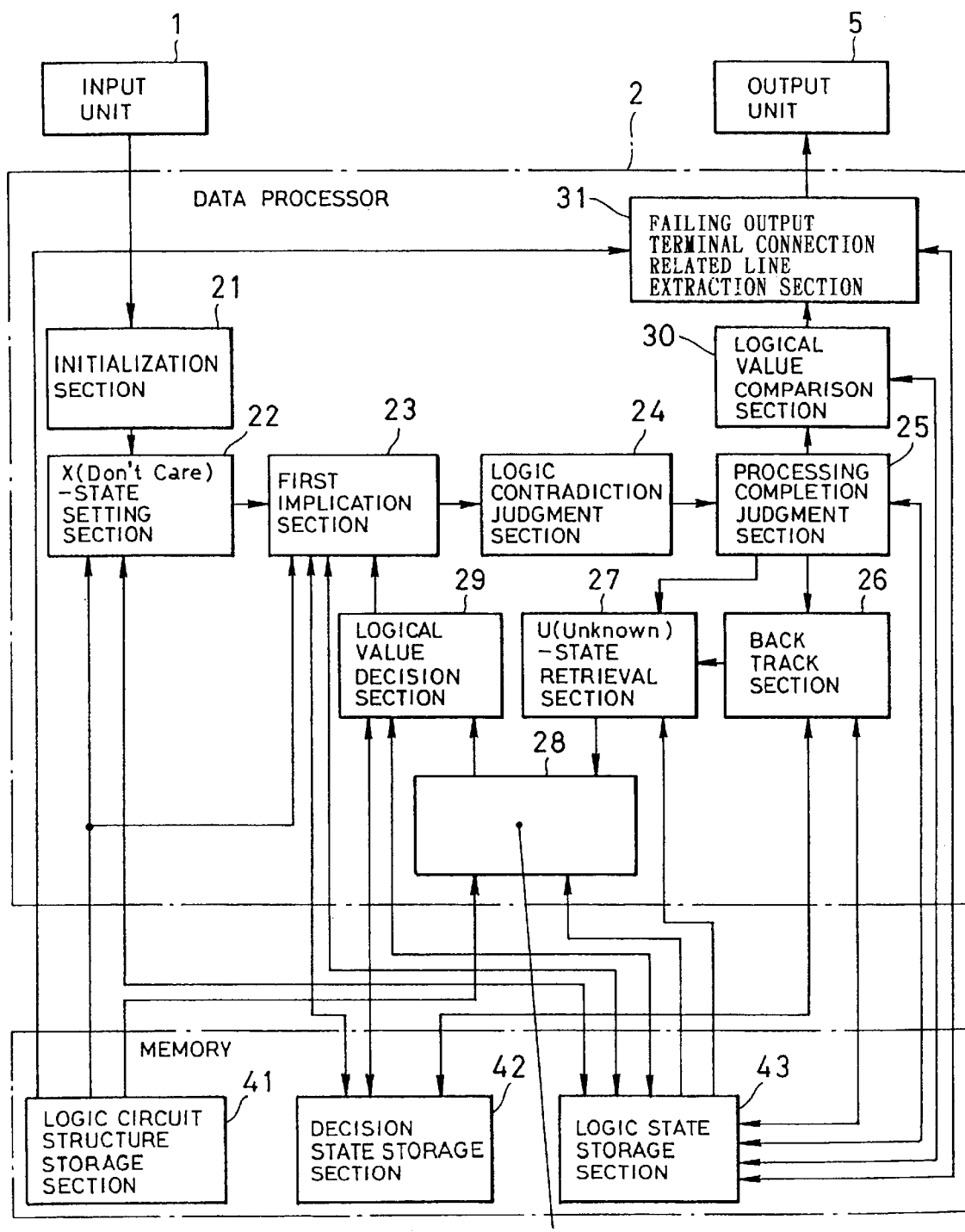
FIG. 1 is a block diagram showing the structure of the error propagation path extraction system of an embodiment of the present invention.

Then, embodiments of the present invention are described by referring to the accompanying drawings. FIG. 1 is a block diagram showing the structure of the error propagation path extraction system of an embodiment of the present invention. In FIG. 1, the error propagation path extraction system of an embodiment of the present invention includes an input unit 1 such as a keyboard, a data processor 2 to be operated through program control, a memory 4 for storing information, and an output unit 5 such as a display unit or printer.

The memory 4 is provided with a logic circuit structure storage section 41, a decision state storage section 42, and logical state storage section 43. The logic circuit structure storage section 41 previously stores the structure of a logic circuit, that is, the type of gate, connective relation between gates, connective relation between gate and signal line, connective relation between signal lines, and structure of a logic circuit.

The decision state storage section 42 stores a decision level showing the number of decisions executed and a decision level when the logical state of each signal line is estimated through implication. The logical state storage section 43 stores the logical state of each signal line under processing and the logical state (normal logical value) of each signal line when a circuit is normal.

The data processor 2 is provided with initialization means 21, X(Don't Care) state (hereafter referred to as X state) setting section 22, first implication section 23, logical contradiction judgment section 24, processing completion judgment section 25, back track section 26, U (Unknown) state (hereafter referred to as U state) retrieval section 27, error propagation path influenced line retrieval section 28, logical value decision section 29, logical value comparison section 30, and failing output terminal connection related line extraction section 31.

The initialization section 21 sets the type of logic circuit supplied from the input unit 1 and the logical state of an input/output terminal. The X state setting section 22 refers to a logic circuit structure stored in the logic circuit structure storage section 41 and a diffusion logical state stored in the logical state storage section 43, sets the initial logical state of each signal line whose logical state is not determined to the X state, and records the X state in the logical state storage section 43.

Figure 11:
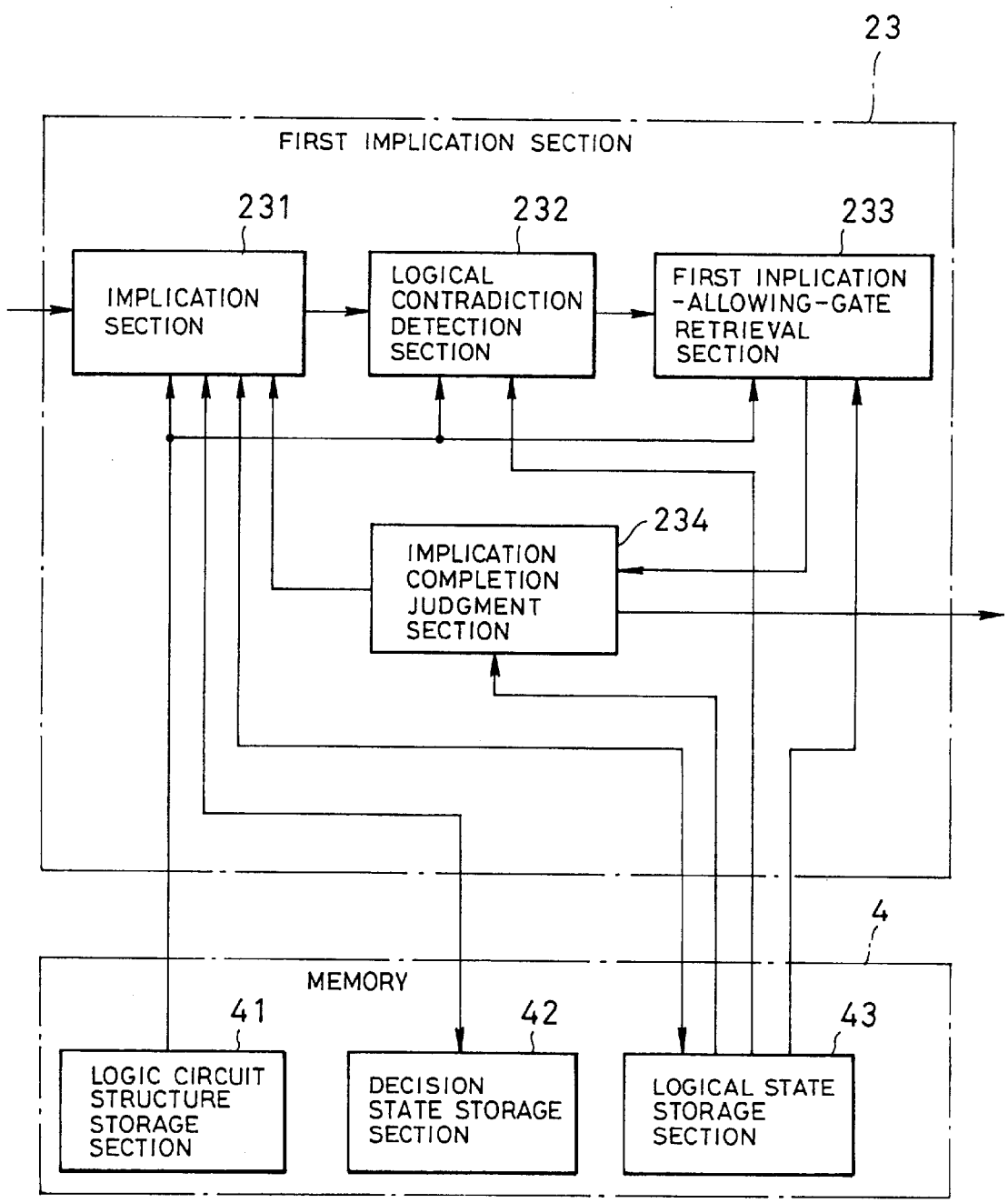
FIG. 11 is a block diagram showing the structure of the first implication means in FIG. 10.
Figure 12:
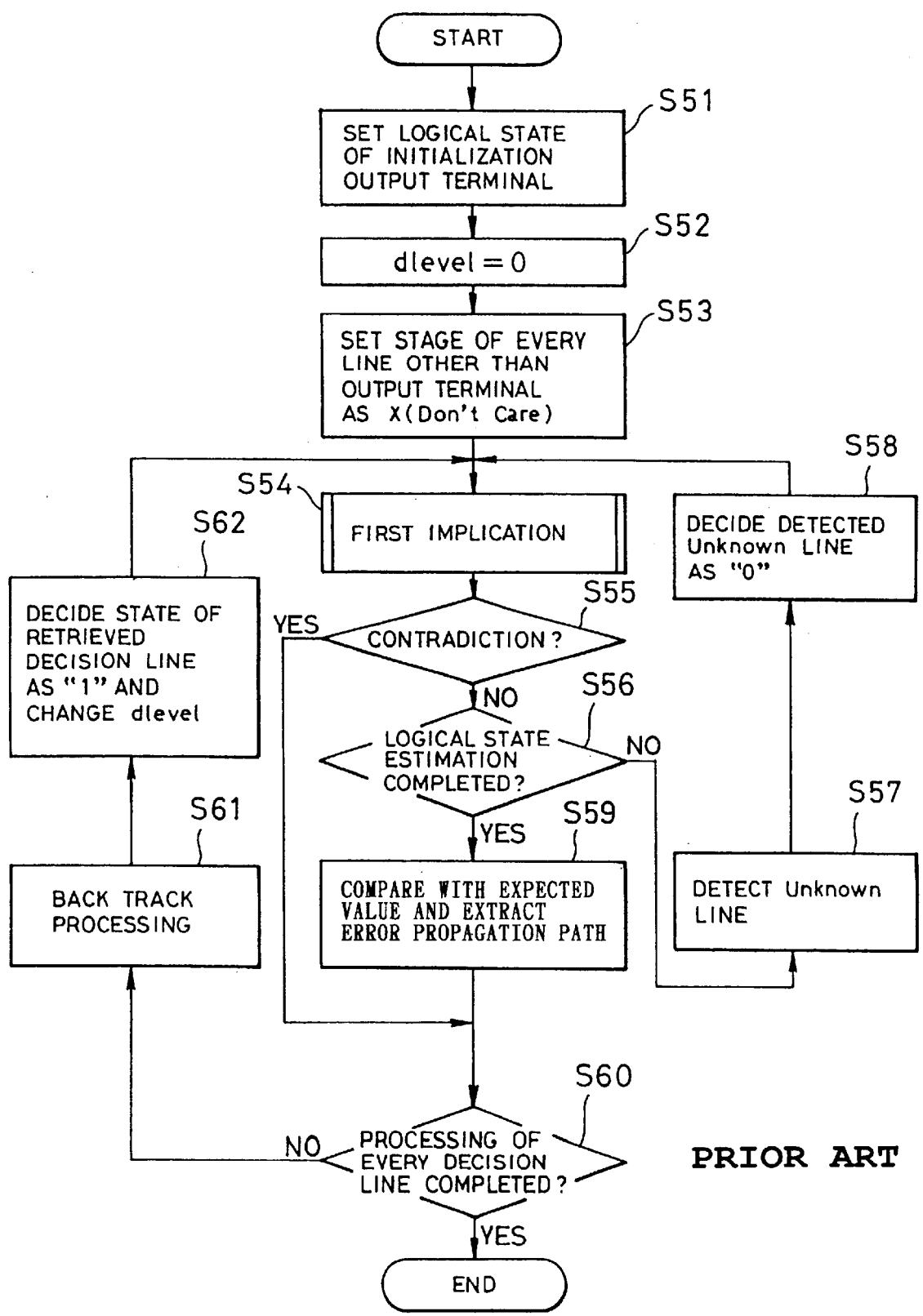
FIG. 12 is a flow chart showing operations of the error propagation path extraction system of a conventional example.

The first implication section 23 includes implication section 231, logical contradiction detection section 232, first implication-allowing gate retrieval section 233, and implication completion judgment section 234 similarly to the first implication section 23 of the conventional example shown in FIG. 11.

The implication section 231 refers to a logic circuit structure stored in the logic circuit structure storage section 41 and the logical state of each signal line stored in the logical state storage section 43 and estimates the logical state of an input/output line at the input/output line set by initialization means 21, the gate connected to the signal line decided by the logical value decision section 29, or the gate detected by the first implication-allowing-gate retrieval section 233. A logical state is estimated by using "0," "1," and "X."

When a new logical value is estimated, the section 231 records the logical value in the logical state storage section 43 and moreover, records a decision level showing under what number of decisions the estimation is executed in the decision state storage section 42.

The logical contradiction detection section 232 refers to the logic circuit structure stored in the logic circuit structure storage section 41 and the logical state of each signal line stored in the logical state storage section 43 and detects a contradiction between the logical state newly decided by the implication section 231 and the logical state decided by the point of time.

The first implication-allowing-gate retrieval section 233 refers to the logic circuit structure stored in the logic circuit structure storage section 41 and the logical state of each signal line stored in the logical state storage section 43 and retrieves an implication-allowing gate. The implication-allowing gate is a gate capable of implicating and deciding the logical state of an input/output line which is connected to the gate and whose logical state is not decided yet in accordance with the function of a gate and the logical state of an input/output line which is connected to the gate and whose logical state is already decided as "0" or "1."

When a gate for implication is not detected by the first implication-allowing-gate retrieval section 233, the implication completion judgment section 234 judges that every implication is completed and completes the processing of the first implication section 23.

The logical contradiction judgment section 24 detects whether a contradiction occurs in the logical state of a signal line in the first implication section 23. The processing completion judgment section 25 refers to the logical state of each signal line stored in the logical state storage section 43 and judges whether the logical state of every signal line is estimated.

The back track section 26 refers to the decision state stored in the decision state storage section 42 and the logical state of a signal line stored in the logical state storage section 43, erases the logical state of the decision level already processed, and returns the logical state of each signal to the logical state before decided. The U-state retrieval section 27 checks the logical state of input/output of a gate in the combinational circuit and retrieves an Unknown-state signal line whose logical state is incomplete.

The error propagation path influenced line retrieval section 28 refers to the logic circuit structure stored in the logic circuit structure storage section 41 and the logical state of each signal line stored in the logical state storage section 43 and retrieves a signal line connected to an error propagation path from an Unknown-state signal line. The signal line connected to an error propagation path includes an error propagation path, that is, a signal line in which an estimated logical state is different from a normal logical value and a signal line which may be brought into an error due to the error of the error propagation path because the signal line is connected through a gate.

The logical value decision section 29 decides a logical state for a signal line whose logical value detected by the error propagation path influenced line retrieval section 28 is under the indeterminate state U and which is connected to an error propagation path through a gate.

The logical value comparison section 30 compares the logical state of each signal line with the logical state of each signal line obtained through the logical simulation by a normal circuit and extracts an error propagation path. The failing output terminal connection related line extraction section 31 checks the physical connective relation between an error propagation path extracted by the logical value comparison section 30 and a failing output terminal and thereby, extracts an error propagation path having a possibility of propagating an error to the failing output terminal when the fault is present on the route, and outputs the data for the error propagation path to the output unit 5.

Figure 2:
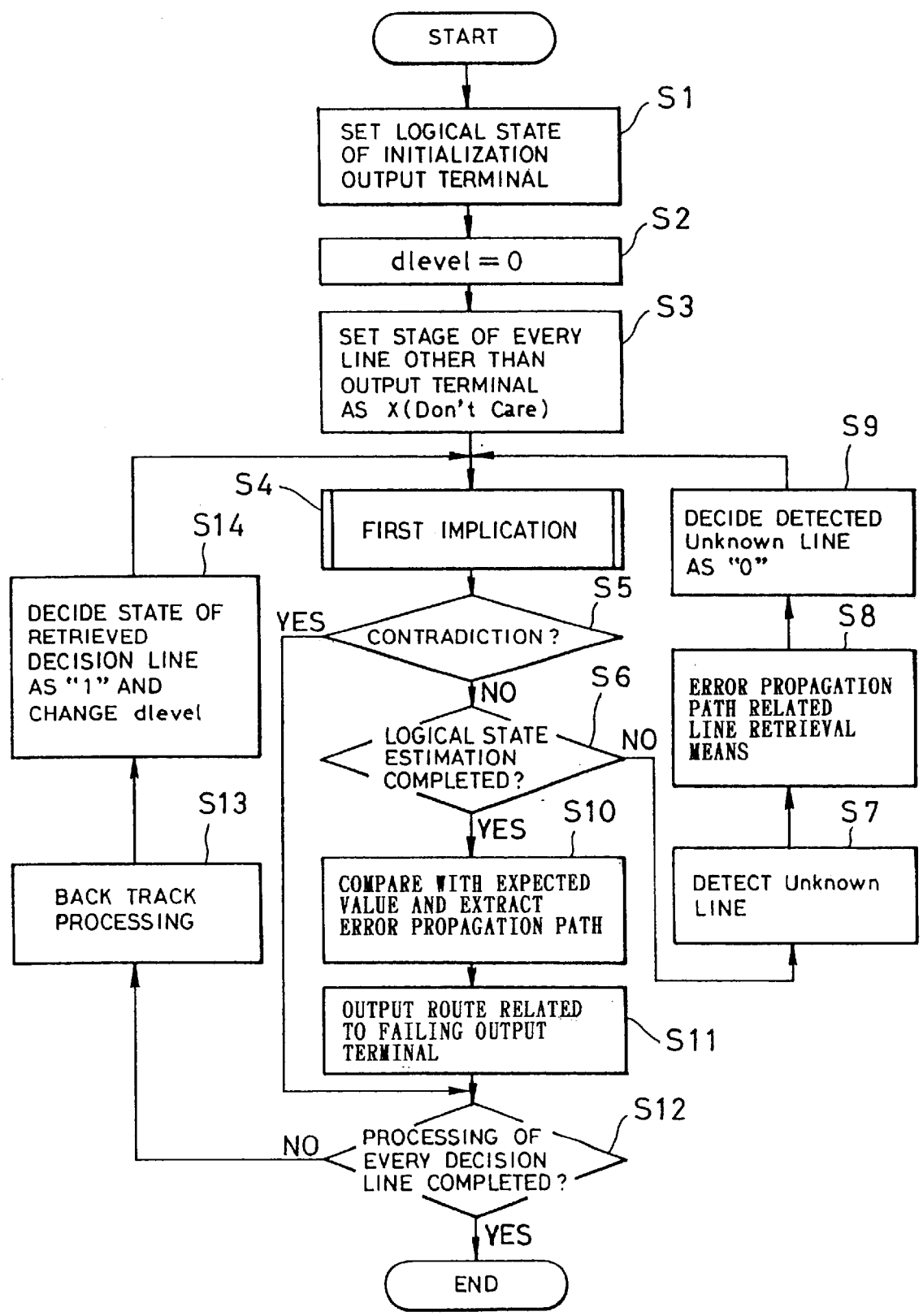
FIG. 2 is a flow chart showing operations of the error propagation path extraction system of an embodiment of the present invention.

FIG. 2 is a flow chart showing operations of the error propagation path extraction system of an embodiment of the present invention. Operations of an embodiment of the present invention are described by referring to operations of the conventional example shown in FIGS. 1, 2, and 14.

A signal line used for the error propagation path extraction system of an embodiment of the present invention has logical states of "0," "1," "U (Unknown), and "X (Don't Care)." The logical state "U (Unknown)" shows an indeterminate state in which the logical state of a signal line cannot be decided as" or "1" but the logical state "X (Don't Care) shows a logical state allowing both logical states "0" and "1" when neither logical state "0" nor logical state "1" of a signal line cause a contradiction in the logical state of the entire logic circuit.

The logical state of an input/output terminal supplied from the input unit 1 is set by the initialization section 21 to initialize a decision level (dlevel) showing the decision frequency (steps S1 and S2 in FIG. 2). The state "X" is set to a signal line whose logical state is not estimated as the initial state of implication and the result is stored in the logical state storage section 43 (step S3 in FIG. 2).

Then, implication is performed by the first implication section 23 (step S4 in FIG. 2). Implication represents an operation for estimating the logical state of the input/output line of a gate not estimated yet in accordance with the logical state of the input/output line of a gate already estimated.

The above implication is described below by referring to the implication of the conventional example shown in FIGS. 1 and 13. First, in the case of the implication section 231 (step S71 in FIG. 13), the logical state of an input/output line is estimated through implication at a detected gate. The logical state of an input/output line is estimated at the input/output line set through initialization (step Si in FIG. 2), the gate connected to the signal line decided by the logical value decision section 29, or the gate detected by the first implication-allowing-gate retrieval section 233. The estimated logical state is recorded together with the decision level at that point of time. FIG. 14 shows an implication example for a two-input NAND gate.

The logical contradiction detection section 232 detects whether a contradiction occurs in a newly-decided logical state. When a contradiction is detected, implication is completed (step S72 in FIG. 13). Unless a contradiction is detected in step S72, the first implication-allowing-gate retrieval section 233 (step S73 in FIG. 13) retrieves other implication-allowing gate.

Then, the implication completion judgment section 234 judges whether every implication is completed. When a gate is detected in step S73, the section 234 judges in step S74 that implication is not completed yet. Unless a gate is detected in step S73, the section 234 judges that implication is completed and completes the first implication.

Then, the logical contradiction judgment section 24 detects the contradiction of the logical state of each signal line under implication (step S5 in FIG. 2). Unless a contradiction is detected by the logical contradiction judgment section 24, the processing completion judgment section 25 refers to the logical state of a signal line stored in the logical state storage section 33 and judges whether the logical state of every signal line is estimated as "0," "1," or "X" (step S6 in FIG. 2). When it is judged in step S6 that the logical state estimation of every signal line is not completed, the U-state retrieval means 27 checks the logical state of input/output of a gate in the combinational circuit and retrieves Unknown-state signal lines whose logical state is incomplete (step S7 in FIG. 2).

A signal line connected to an error propagation path is retrieved out of the Unknown-state signal lines (step S8 in FIG. 2). A signal line connected to an error propagation path represents an error propagation path, that is, a signal line whose estimated logical state is different from a normal logical value or a signal line connected through a gate.

A detected signal line is decided as "0," a decision level (dlevel) showing the decision frequency is increased by 1 (step S9 in FIG. 2), and the implication processing (step S4 in FIG. 2) by the first implication section 23 is restarted. when it is judged by the processing completion judgment section 25 that the logical state of every signal line is estimated, the logical state in a circuit is decided as "0," "1," or "X." Therefore, the logical value comparison section 30 (step S10 in FIG. 2) extracts a signal line having a state different from a normal logical value, that is, an error propagation path.

Moreover, the failing output terminal connection related line extraction section 31 checks the physical connective relation between a route and a failing output terminal and thereby, extracts an error propagation path directly influencing the failing output terminal when a fault is present on the route out of error propagation paths, and output the extracted error propagation path to the output unit 5 (step S11 in FIG. 2).

Then, it is judged whether decision processings for both 37 0" and "1" are completed for every decided line (step S12 in FIG. 2). When it is judged in step S12 that the logical state of every signal line is estimated, the logical state of a signal line in the combinational circuit is estimated as "0," "1," or "X." Also when a contradiction is detected by the logical contradiction judgment section 24, the decision processing in step S12 is performed.

When it is judged by the processing completion judgment section 25 (step S12 in FIG. 2) that decision processing is not completed, the back track section 26 retrieves one decision line having the highest decision level among decision lines not decided as the state "1" by the back track section 26, initializes the detected decision line to the state "U" showing that the logical state of a signal line estimated through the decision having a decision level equal to or higher than the decision level of the detected decision line is indeterminate, and the logical state of each signal line is returned to the logical state before performing the decision (step S13 in FIG. 2).

It is judged by the logical value decision section 29 that the state of the decision line detected by the back track section 26 is decides as "1" (step S14 in FIG. 2) and the implication is restarted by the first implication section 23 (step S4 in FIG. 2).

When it is judged that decision processing is completed by the processing completion judgment section 25 (Step S12 in FIG. 2), error propagation path extraction processing is completed. In this case, it is also possible to obtain only one signal line whose logical state is "U" and which is connected with an error propagation path by using the functions of the U-state retrieval section 27 and error propagation path influenced line retrieval section 28 together.

The error propagation path extraction system of an embodiment of the present invention retrieves only signal lines connected to error propagation paths when retrieving signal lines to be decided. Therefore, it is possible to quickly extract an error propagation path because a logical value is not decided for a signal line not connected with an error propagation path and thereby, the decision frequency decreases.

Because only a route capable of propagating an error from an extracted error propagation path to a failing output terminal is output, an extra route having no possibility of propagating an error to the failing output terminal is not output. Moreover, for purposed faults, it is possible to obtain every error propagation path that may be present in addition to a single fault like the case of the fault dictionary method. Furthermore, because logical-value decision can be independently processed, it is possible to realize efficient acceleration according to parallel processing.

Figure 3:
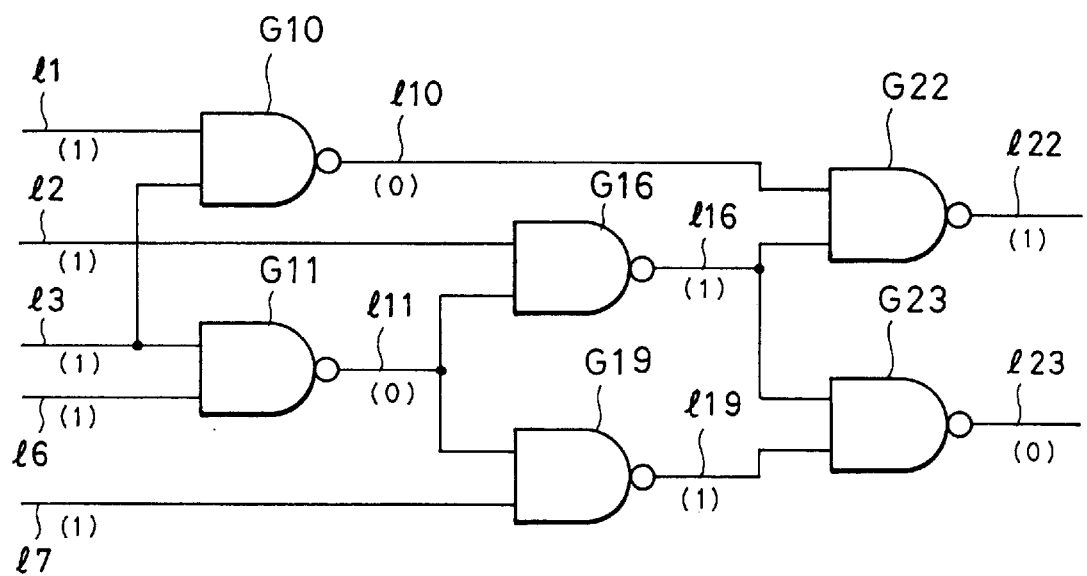
FIG. 3 is an illustration showing a circuit for explaining operations of the error propagation path extraction system of an embodiment of the present invention.
Figure 4:
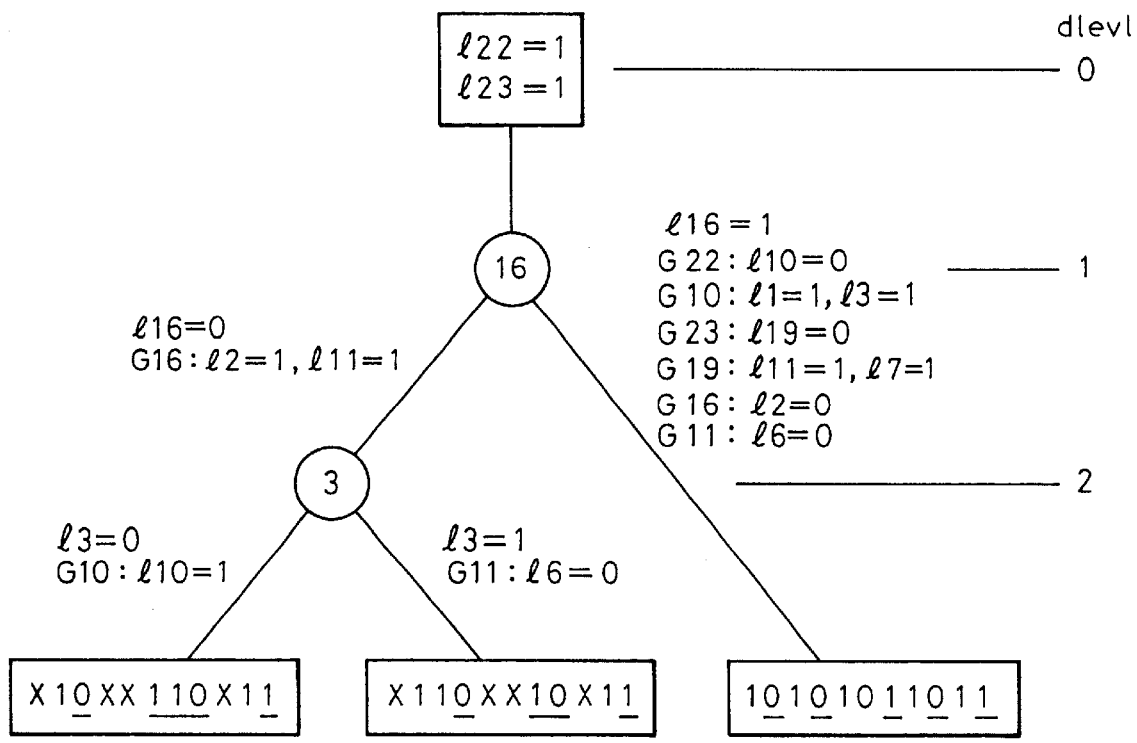
FIG. 4 is an illustration showing a decision tree structure for explaining operations of the error propagation path extraction system of an embodiment of the present invention.

FIG. 3 is an illustration showing a circuit for explaining operations of the error propagation path extraction system of an embodiment of the present invention and FIG. 4 is an illustration showing a decision tree structure for explaining operations of the error propagation path extraction system of an embodiment of the present invention. Operations of the error propagation path extraction system of an embodiment of the present invention are described below in detail by referring to the first implication section 23 of the conventional example shown in FIGS. 1 to 4 and FIG. 11, the implication of the conventional example shown in FIG. 13, and operations of the conventional example shown in FIG. 14 and using the ISCAS'-85 benchmark circuit C17.

An error propagation path when the logical state of the output terminal of the ISCAS'-85 benchmark circuit C17 becomes line22=1 and line23=1 is extracted. However, the normal logical value of each signal line is previously obtained through a logical simulation. Moreover, a line and Gate in a drawing or description show a signal line number and a gate number and shown by line and Gate or 1 and G.

For example, a signal line having number 10 is expressed as line 10 (110) and a gate having the line 10 as an output line is expressed as Gate 10 (G10). Moreover, the numeral in parentheses of a logical value in a drawing and description shows the normal logical value of the signal line.

When line22=1(1) and line23=1(0) are input as logical states of the output terminal of the ISCAS'-85 benchmark circuit C17 by the input unit 1 (step S1 in FIG. 2), dlevel is initialized to "0" (step S2 in FIG. 2), and both logical states of the output terminals line 22 and line 23 are set to "1" and the state of signal lines other than the output terminals are set to "X" by the initialization section 21 and X-state setting section 22 (step S3 in FIG. 2).

The first implication section 23 performs first implication (step S4 in FIG. 2). As long as a contradiction does not occur in every implication-allowing gate, the section 23 performs implication and estimates the logical state of an estimable signal line. In this case, there is not signal line to be implicated.

Because there is no signal line whose logical state is newly decided in step S4, no contradiction occurs in step S5. By retrieving an Unknown line, line 10, line 16, and line 19 are detected (step S7 in FIG. 2). In this case, because signal lines having a possibility of propagating an error to the error propagation path, that is, line23=1(0) are line 16 and line 19 (step S8 in FIG. 2), line16=0 is decided.

Figure 13:
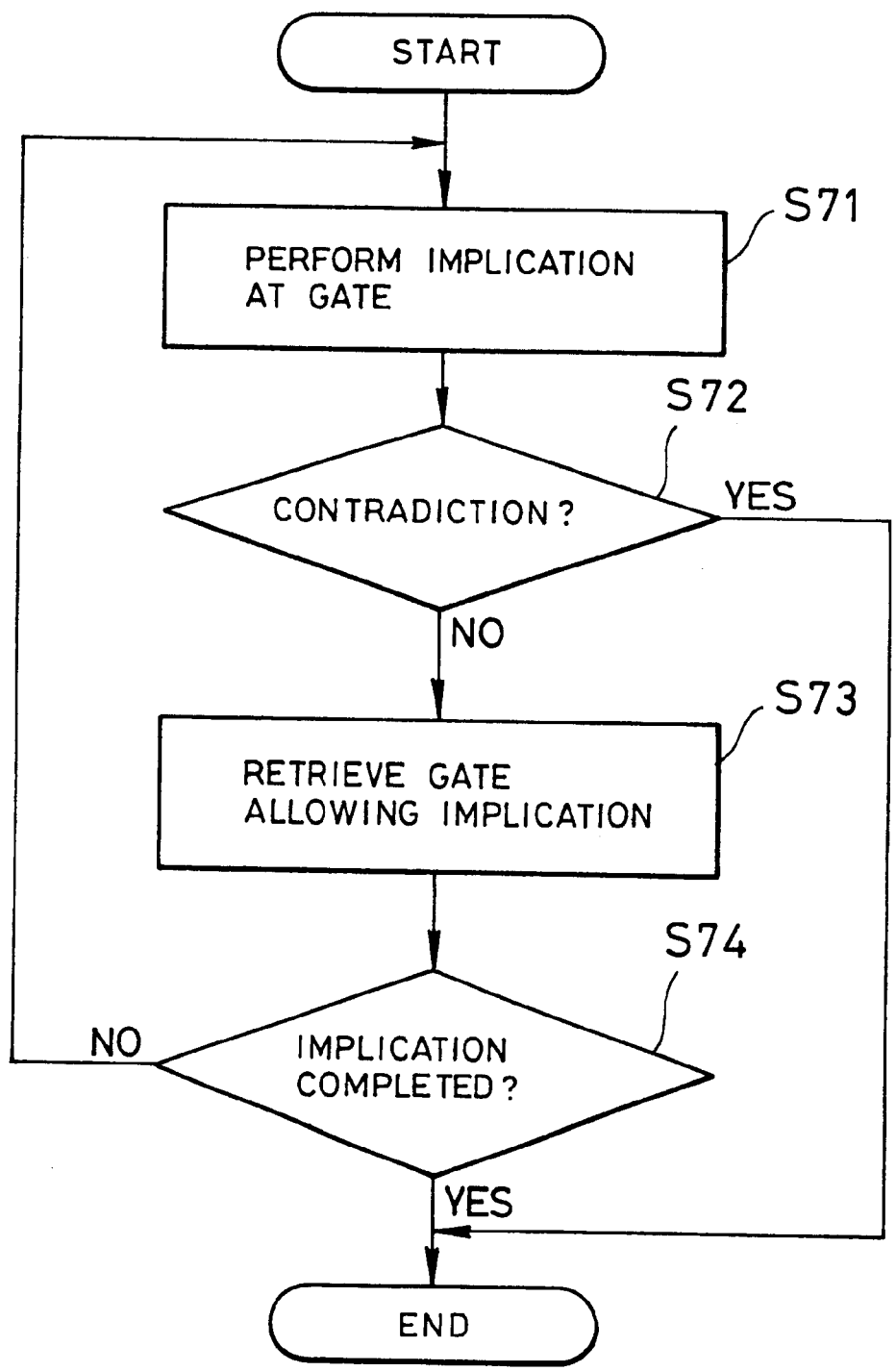
FIG. 13 is a flow chart showing the implication by the implication means in FIG. 11.
Figure 14:
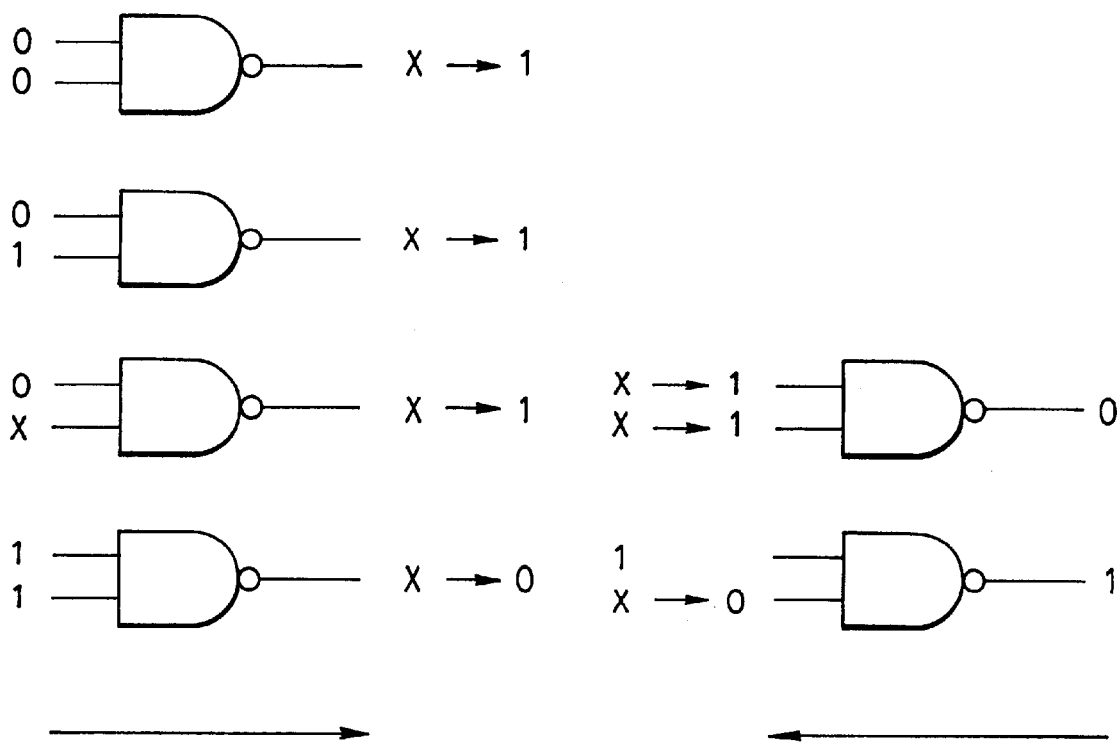
FIG. 14 is an illustration showing a circuit for explaining operations of the error propagation path extraction system of a conventional example.
Figure 15:
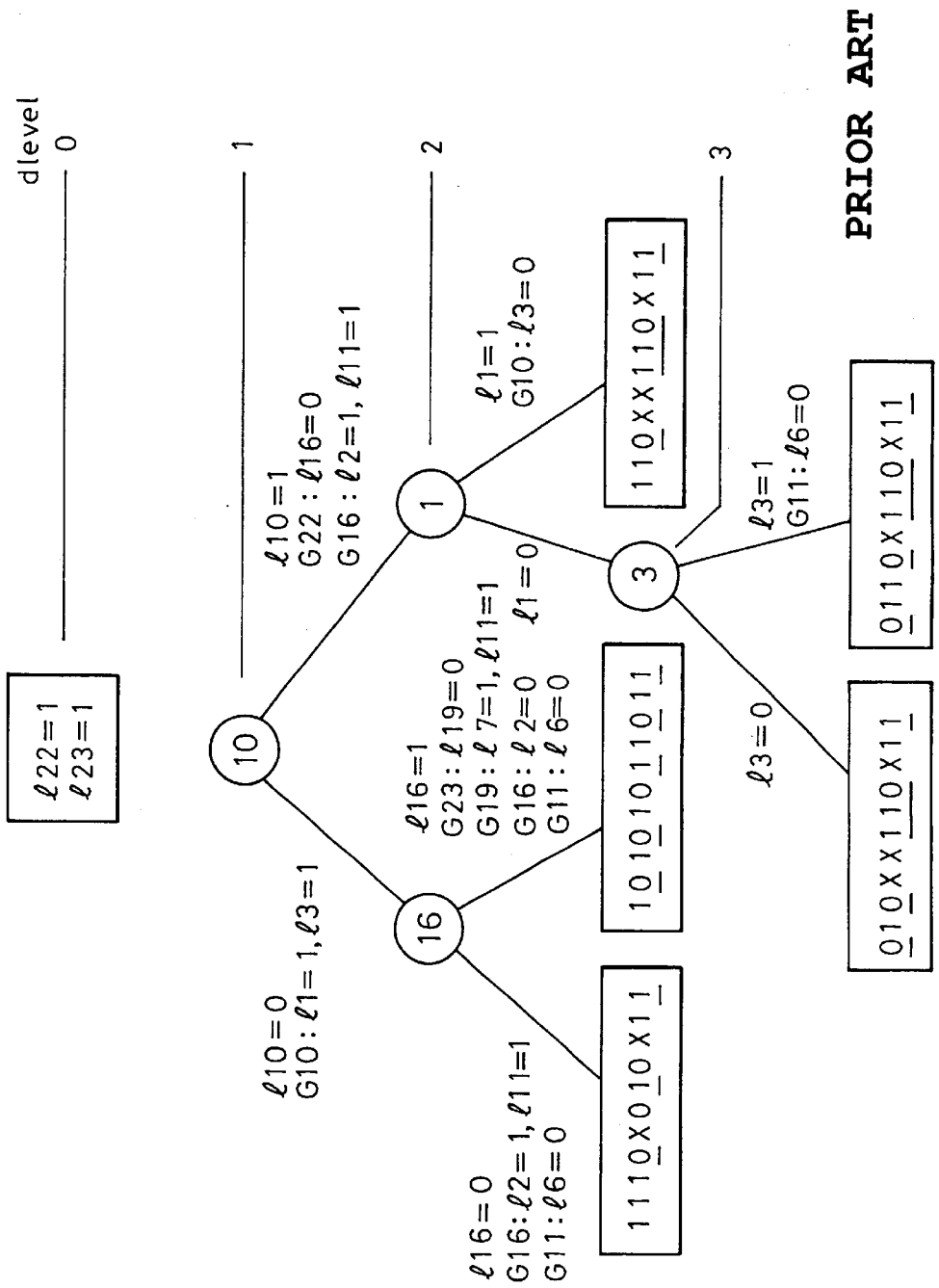
FIG. 15 is an illustration showing a decision tree structure for explaining operations of the error propagation path extraction system of a conventional example.

By performing implication from line16=0 in step S4, line2=1 and line11=1 are estimated through the implication in Gate 16 (step S73 in FIG. 13). Therefore, the logical states line2=1 and line11=1 newly decided in step S4 do not cause any contradiction (step S5 in FIG. 2). By retrieving an Unknown line, line 3 and line 6 are detected (step S7 in FIG. 2), line 3 is selected because both line 3 and line 6 are connected with line16=0(1) and line11=1(0) (step S8 in FIG. 2), and line3=0 is decided (step S9 in FIG. 2). By performing implication from line3=0 in step S4, line1120=1 is estimated at Gate 10 but in this case, no contradiction occurs.

No contradiction occurs in the first implication in step S4 (step S5 in FIG. 2). Moreover, by completing estimation processing because the Unknown line disappears (step S6 in FIG. 2), comparing an estimated logical state with a normal logical value, and extracting an error propagation path, line3=0(1), line10=1(0), liknel1=1(0), line16=0(1), and line23=1(0) are extracted (step S10 in FIG. 2).

However, line 10 does not propagate an error to a failing output terminal. That is, even if a fault of line10=1 occurs, it does not directly cause a fault output of line23=1(0). Therefore, line3=0(1), line11=1(0), line16=0(1), and line23=1(0) are output as error propagation paths having a possibility of propagating an error to a failing output terminal. The decided line3=0 is decided again as line3=1 (steps 13 and 14 in FIG. 2) and processing is continued.

Hereafter, as shown by the decision tree structure in FIG. 4, it is possible to obtain an error propagation path meeting line22=1 and line23=1 by repeating decision, implication, and back track.

By performing decisions of both "0" and "1" for two signal lines a total of four times, it is possible to obtain three types of error propagation paths meeting the logical state of an output terminal. Moreover, because logical value decision can be independently processed, it is possible to realize efficient acceleration according to parallel processing. For example, in FIG. 4, efficient high-speed processing can be performed by a parallel computer because it is possible to independently process line16=0 and line16=1.

Figure 5:
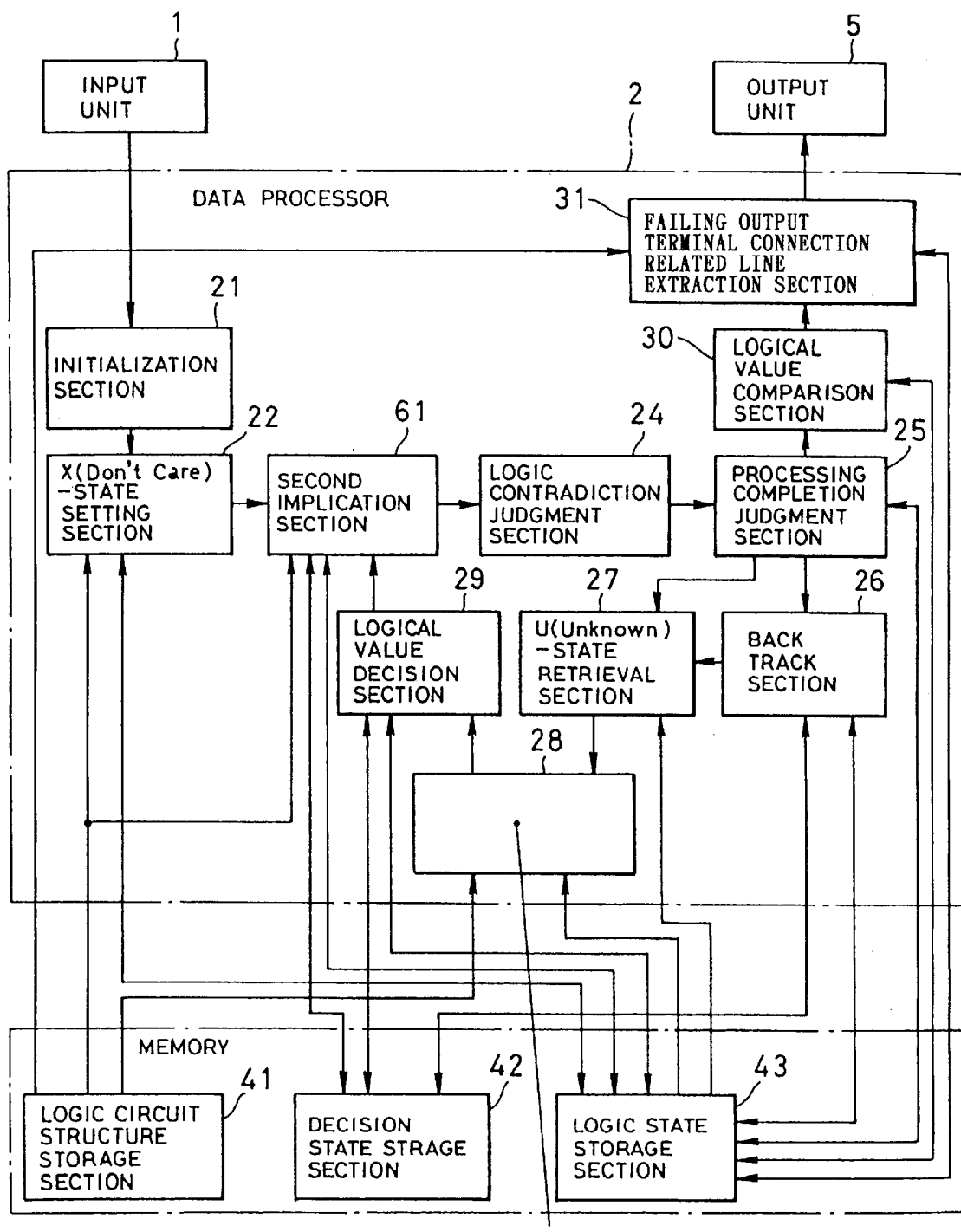
FIG. 5 is a block diagram showing the structure of the error propagation path extraction system of another embodiment of the present invention.
Figure 6:
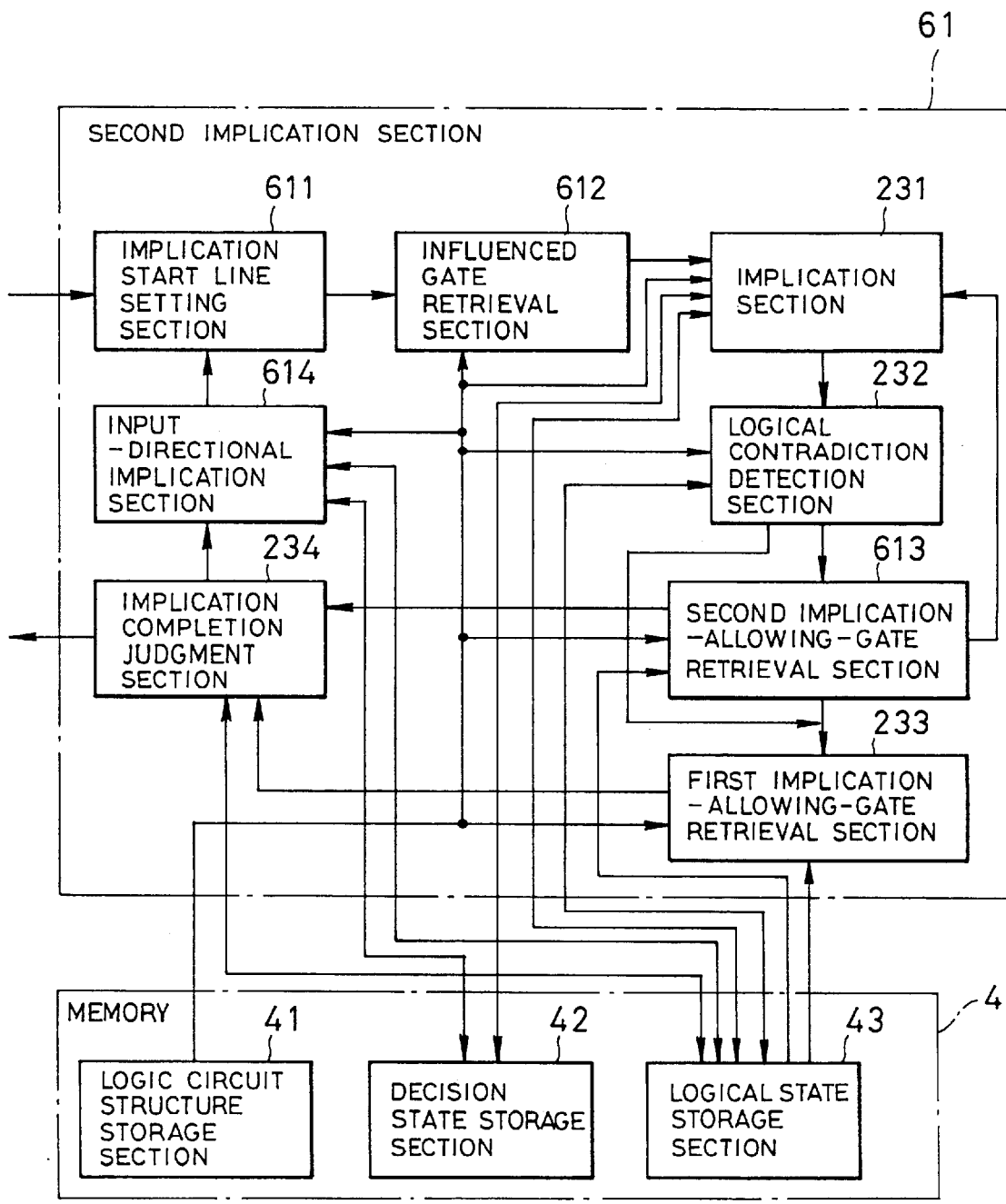
FIG. 6 is a block diagram showing the structure of the second implication means in FIG. 5.

FIG. 5 is a block diagram showing the structure of the error propagation path extraction system of another embodiment of the present invention. FIG. 6 is a block diagram showing the structure of the second implication section shown in FIG. 5. In these illustrations, the error propagation path extraction system of another embodiment of the present invention has the same structure as the error propagation path extraction system of the embodiment of the present invention shown in FIG. 1 except that the data processor 6 is provided with a second implication section 61 instead of the first implication section 23 of the data processor 2 and a processing flow from the logical contradiction judgment section 24 up to the logical value comparison section 30 is added and the same component is provided with the same symbol. Moreover, operations of the same component are the same as those of the same component of an embodiment of the present invention.

The second implication section 61, as shown in FIG. 6, has the implication section 231 owned, logical contradiction detection section 232, first implication-allowing-gate retrieve section 233, and implication completion judgment section 234 included in the first implication section 23 and moreover, has an implication start line setting section 611, an influenced gate retrieval section 612, a second implication-allowing-gate retrieval section 613, and an input-directional implication section 614.

The implication start line setting section 611 sets a signal line whose logical state is decided by the logical value decision section 29 or initialization section 21 as an implication start line. The influenced gate retrieval section 612 retrieves a gate influenced by the logical state of a signal line connected to the output side of the implication start line, that is, the decided loss of the implication start line.

The second implication-allowing-gate retrieval section 613 refers to the logic circuit structure stored in the logic circuit structure storage section 41 and the logical state of each signal line stored in the logical state storage section 43 and retrieves a gate connected to the signal line whose logical state is decided by the implication section 231 and an implication-allowing gate.

The input-directional implication section 614 refers to the logic circuit structure stored in the logic circuit structure storage section 41 and the logical state of each signal line stored in the logical state storage section 43 at the gate detected by the first implication-allowing-gate retrieval section 233 to perform input-directional implication.

Figure 7:
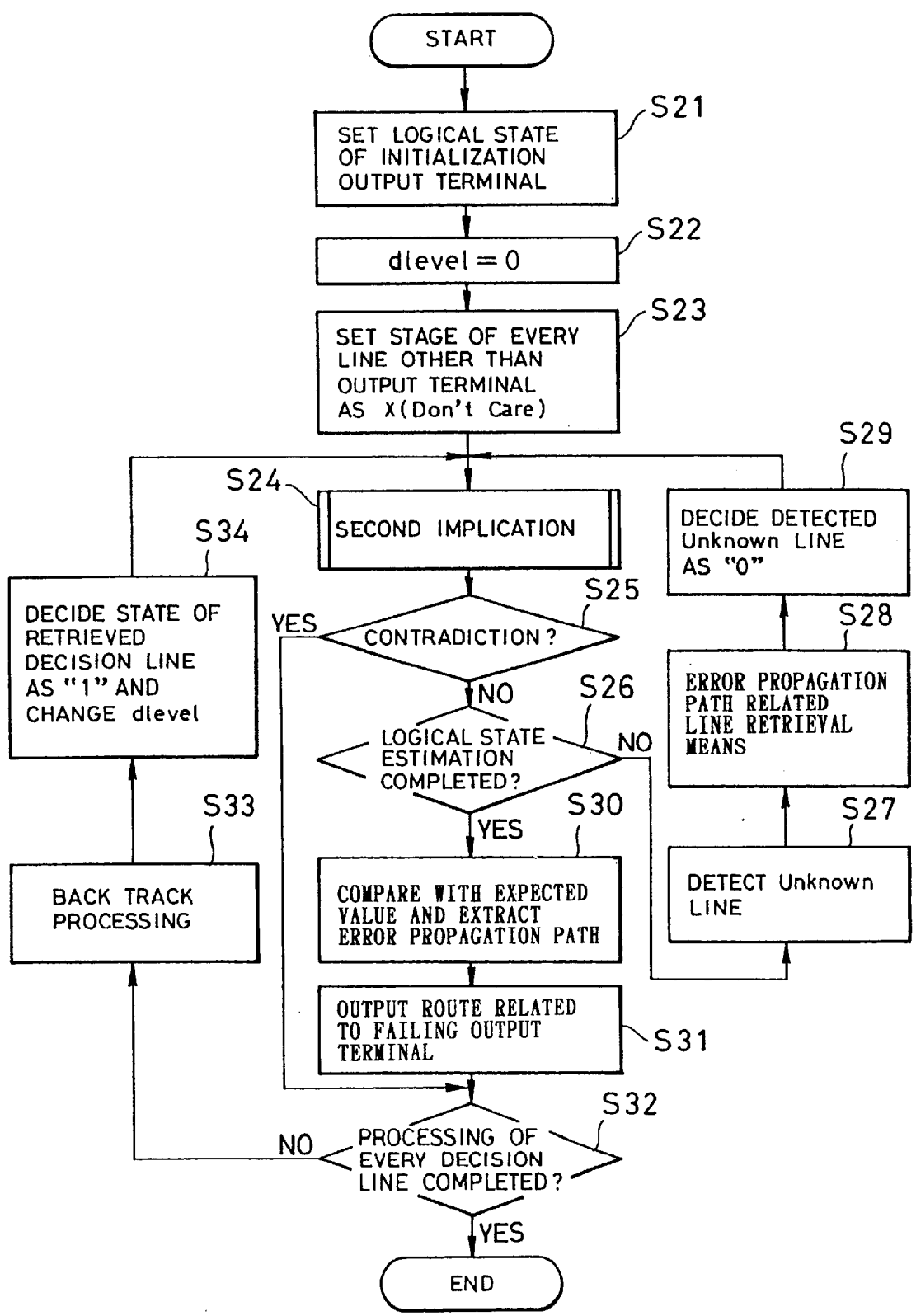
FIG. 7 is a flow chart showing operations of the error propagation path extraction system of still another embodiment of the present invention.

FIG. 7 is a flow chart showing operations of the error propagation path extraction system of still another embodiment of the present invention. Operations of the error propagation path extraction system of still another embodiment of the present invention are described below by referring to FIGS. 5 to 7.

In this case, steps S21 to S23 and S26 to S33 in FIG. 7 are the same as steps S1 to S3 and S6 to S13 in FIG. 2. Operations shown in S21 through S23 and S26 through S33 of the initialization section 21, X-state setting section 22, first implication section 23, processing completion judgment section 25, back track section 26, U-state retrieval section 27, error propagation path influenced line retrieval section 28, logical value decision section 29, logical value comparison section 30, and failing output terminal connection related line extraction section 31 are the same as those of an embodiment of the present invention. Therefore, description of the operations is omitted.

The error propagation path extraction system of an embodiment of the present invention handles a combinational circuit as a normal circuit when estimating the logical state of each signal line and when a logical contradiction occurs, disuses the information at that time and retries decision through the back track processing.

A contradiction must inevitably occur in implication when a fault is present in a combinational circuit. Therefore, when the logical state of a signal line is estimated through input-directional implication, it is confirmed whether a contradiction occurs between the above state an d the logical state decided by the point of time. If a contradiction occurs, error propagation paths having been obtained so far are output.

Therefore, in the case of still another embodiment of the present invention, unless a contradiction is detected by the logical contradiction judgment section 24 (step S25 in FIG. 7), the logical value comparison section 30 (step S30 in FIG. 7) extracts a signal line waiting for a state different from a normal logical value, that is, an error propagation path.

Moreover, the failing output terminal connection related line extraction section 31 checks the physical connective relation between a route and a failing output terminal and thereby, extracts an error propagation path directly influencing the failing output terminal when a fault is present on the route out of error propagation paths, and outputs the route to the input unit 5 (step S31 in FIG. 7).

Figure 8:
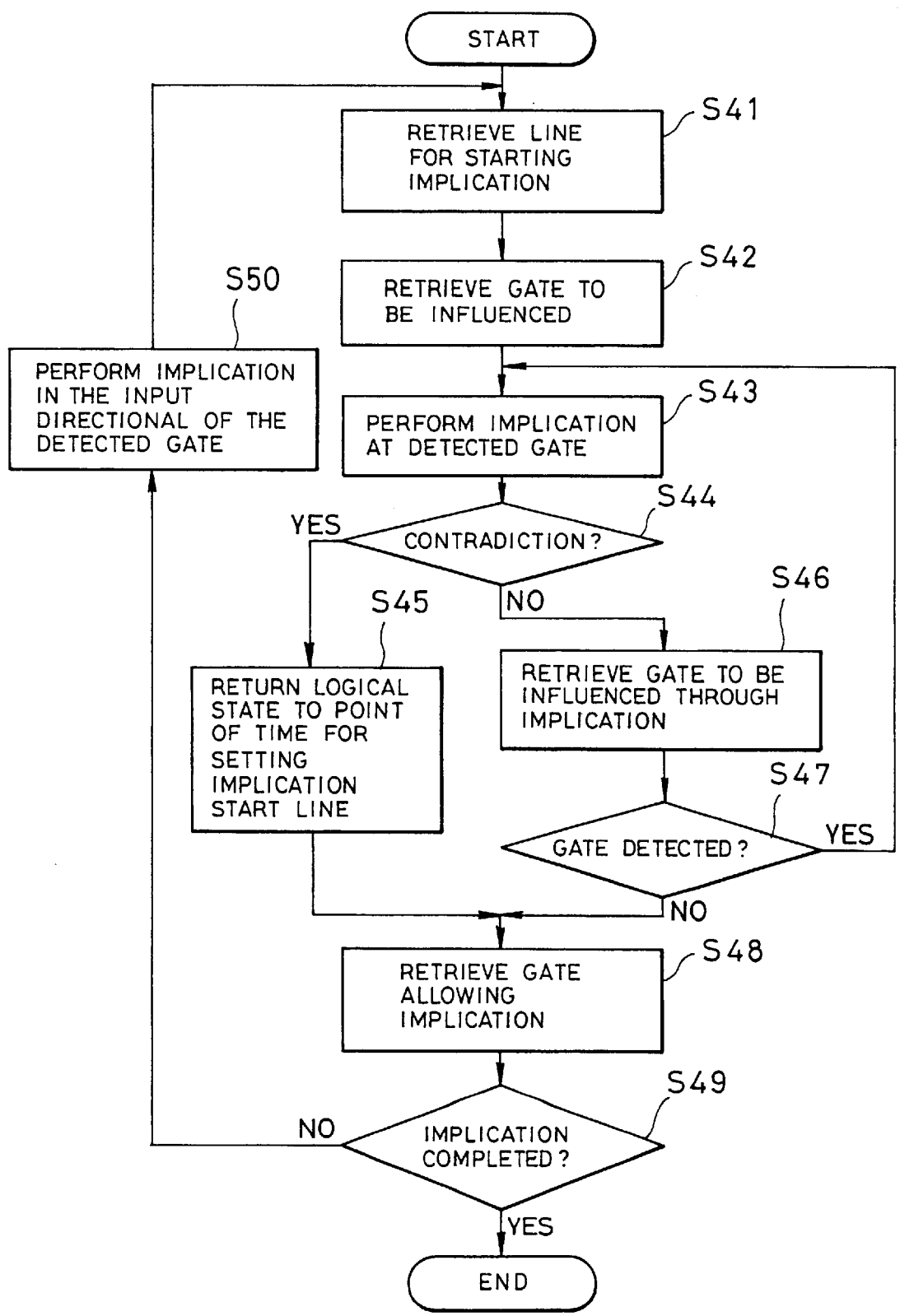
FIG. 8 is a flow chart showing the implication by the second implication means in FIG. 6.

FIG. 8 is a flow chart showing the implication by the second implication section 61 in FIG. 6. Operations of implication by the second implication section 61 are described below by referring to FIGS. 6 and 8.

The implication start line setting section 611 (step S41 in FIG. 8) sets a signal line for starting implication. Moreover, the section 611 sets the fault output line set by the logical value decision section 29 or initialization section 21 as an implication start line. The influenced gate retrieval section 612 (step S42 in FIG. 8) retrieves a gate connected to the output side of the implication start line, that is, a gate influenced by the fact that the logical state of the implication start line is decided.

The implication section 231 (step S43 in FIG. 8) estimates the logical state of an input/output line through implication at the gate detected in step S42. The estimated logical state is recorded together with the decision level at that point of time. For example, FIG. 14 shows an implication example in the case of a two-input NAND gate.

The logical contradiction detection section 232 (step S44 in FIG. 8) detects whether a contradiction occurs in a newly-decided logical state. When the section 232 detects a contradiction, it returns the logical state of each signal line up to the point of time when setting an implication start line because the logical state of an implication start line causes a contradiction. Moreover, the section 232 reverses the logical state of the implication start line (step S45 in FIG. 8) and then, starts the processing in step S48.

Unless a contradiction is detected in step S44, the second implication-allowing-gate retrieval section 613 (step S46 in FIG. 8) retrieves a gate to be influenced by a signal line whose logical state is decided in step S43. When a gate to be influenced is detected in step S46, the section 613 restarts the processing of the implication section 231 in order to perform the implication of the detected gate (step S43 in FIG. 8).

Unless a gate to be influenced is detected in step S46, the first implication-allowing-gate retrieval section 233 (step S48 in FIG. 8) retrieves other implication-allowing gate. A gate detected in this case is a gate connected to the input side of the implication start line.

When the processing in step S48 is started without the fact that a contradiction is detected in step S44, it is represented that the logical state of the implication start line meets the logical state of the output side and logical states obtained by this point of time meet the output logical state of the circuit.

Then, the implication completion judgment section 234 judges whether every implication is completed. When a gate is detected in step S48, the section 234 judges that implication is not completed yet and the input-directional implication section 614 performs implication in the input directional of the detected gate (step S50 in FIG. 8). In this case, a signal line whose logical state is newly decided is used as an implication start line and the processing in step S41 is restarted.

Unless a gate is detected in step S48, it is judged that implication is completed in step S49 and the first implication is completed. In this case, when the logical contradiction detection section 232 (step S44 in FIG. 8) detects a contradiction, the logical state of each signal line is returned up to the point of time when setting the implication start line and the logical state of the implication start line is reversed and then, the processing is continued. However, it is possible to extract an error propagation path without reversing the logical state.

The error propagation path extraction system of still another embodiment of the present invention executes implication while confirming whether a contradiction occurs between the logical state estimated through implication and the logical state estimated by the point of time. Therefore, error propagation paths obtained by the point of time when a logical contradiction occurs are routes capable of propagating an error to a failing output terminal.

Therefore, it is possible to an error propagation path due to a fault in a combinational circuit.

The official gazette of Japanese Patent Application Laid-Open No. 8-94714 discloses a system for estimating a fault portion in a combinational circuit by following an error propagation path from a failing output terminal in the input direction. This system estimates a fault portion in a combinational circuit by assuming that a fault occurs in the input line of a gate having a fault-state output line and judging that the assumed fault can be present when the fault meets the logical state of the output terminal.

As a result, acceleration of fault portion estimation is realized by following only the fault. However, because no implication is applied to a signal line whose logical state is normal, the above system cannot be applied to a combinational circuit including a recollection circuit.

However, the error propagation path extraction system of still another embodiment of the present invention executes processing while confirming whether a contradiction occurs between the logical state of an estimated signal line and the logical state of each signal line estimated by the point of time independently of the logical state of the e stimated signal line. Therefore, the system is also effective for a circuit including a recollection circuit.

Operations of the error propagation path extraction system of an embodiment of the present invention are described below in detail by referring to the first implication means 23 of the conventional example shown in FIGS. 3 to 8 and FIG. 11, implication of the conventional example shown in FIG. 13, and operations of the conventional example shown in FIG. 14 and using the ISCAS'-85 benchmark circuit C17.

An error propagation path when the logical state of the output terminal of the ISCAS'-85 benchmark circuit C17 becomes line22=1 and line23=1 is extracted. However, the normal logical value of each signal line is previously obtained through a logical simulation.

When the logical state of the output terminal of the ISCAS'-85 benchmark circuit C17 is input as line22=1(1) and line23=1(0) through the input unit 1 (step S21 in FIG. 7), dlevel is initialized to "0" (step S22 in FIG. 7), and logical states of line 22 and line 23 are set to "1" and the state of a signal line other than the output terminal is set to "X" by the initialization section 21 and X-state setting section 22 (step S23 in FIG. 7).

The second implication section 61 performs second implication (step S24 in FIG. 7). The implication start line setting section 611 sets line 23 serving as a failing output terminal as an implication start line (step S41 in FIG. 8).

Because line 23 is an output terminal, the gate at the output side to be influenced is not detected (step S42 in FIG. 8). Moreover, though Gate 23 is detected as an input-side gate (step S48 in FIG. 8), implication is completed because the logical state of the input line of Gate 23 is not implicated (step S49 in FIG. 8).

Because there is not a signal line whose logical state is newly decided in step S24, no contradiction occurs in step S25. By retrieving Unknown line, line 10, line 16 and line 19 are detected (step S27 in FIG. 7). In this case however, because signal lines having a possibility of propagating an error to an error propagation path, that is, line23=1(0) are line 16 and line 19 (step S28 in FIG. 7), line16=0 is decided.

When setting line 16 to an implication start line (step S41 in FIG. 8), a gate at the output side to be influenced is Gate 22 (step S42 in FIG. 8). Therefore, implication is performed at Gate 22 (step S43 in FIG. 8). In this case, because a contradiction is not detected (step S44 in FIG. 8) or there is not a signal line whose logical state is newly decided, a gate to be influenced by implication is not detected (step S47 in FIG. 8).

Gate 16 connected to the input side of the implication start line (line 16) is detected (step S49 in FIG. 8) where implication is performed in the input direction and line2=1 and line11=1 are estimated (step S50 in FIG. 8). The second implication is continued by assuming the implication start line as line 2 and line 11 (step S41 in FIG. 8). Though a gate to be influenced by line 2 is not detected, Gate 19 is detected as a gate to be influenced by line 11 (step S42 in FIG. 8). There is not a signal line whose logical state is newly decided through implication in Gate 19 or no contradiction occurs (Steps S43 and S44 in FIG. 8).

Though Gate 11 is detected by retrieving the gate at the input side of the implication start line, implication is completed because the logical state of the input line of Gate 11 is not implicated (step S49 in FIG. 8). The logical states line2=1 and line11=1 newly decided in step S24 do not cause any contradiction (step S25 in FIG. 7). By retrieving Unknown line, line 3 and line 6 are detected (step S27 in FIG. 7). Because both lines 3 and 6 are connected with error propagation paths line23=1(0), likne16=0(1), and line11=1(0), line 3 is selected (step S28 in FIG. 7) and decided as line3=0 (step S29 in FIG. 7).

By setting line 3 as an implication start line (step S41 in FIG. 8), implication is performed at Gate 10 (step S43 in FIG. 8) because the output-side gate is Gate 10 (step S42 in FIG. 8). In this case, no contradiction occurs but line10=1 is estimated and Gate 22 is detected as a gate to be influenced by line10=1 (steps S43 to S47 in FIG. 8). Though implication is performed at Gate 22, there is no signal line whose logical state is newly decided or no contradiction occurs (steps S43 and S44 in FIG. 8).

No contradiction occurs in the second implication in step S24 (step S25 in FIG. 7). Moreover, by completing estimation processing because Unknown line disappears and (step S26 in FIG. 7), comparing the estimated logical state with a normal logical value, and extracting an error propagation path, line3=0(1), line10=1(0), line11=1(0), line16=0(1), and line23=1(0) are extracted (step S30 in FIG. 7).

However, line 10 does not have a possibility of propagating an error to a failing output terminal. That is, even if a fault of line10=1 occurs, it does not directly cause a fault output of line23=1(0). Therefore, line3=0(1), line11=1(0), line16=0(1), and line23=1(0) are output as error propagation paths having a possibility of propagating a fault to a failing output terminal. The decided line3=0 is re-decided as line3=1 (steps S33 and S34 in FIG. 7) to continue processing.

Hereafter, as shown by the decision tree structure in FIG. 4, it is possible to obtain a error propagation path meeting line22=1 and line23=1 by repeating decision, implication, and back track.

By applying decisions of both "0" and "1" to signal lines at two portions a total of four times, it is possible to obtain three types of error propagation paths meeting the logical state of an output terminal. Moreover, the logical states of the signal lines respectively enclosed by a quadrangular frame in FIG. 4 are shown in order of line 1, line 2, line 3, line 6, line 7, line 10, line 11, line 16, line 19, line 22, and line 23. Moreover, a state whose logical state is underlined shows a error propagation path different from a normal logical value.

In this case, it is shown that an "X"-state signal line can be "0" or "1." Therefore, the "X"-state signal line can be also handled as a error propagation path. In the case of this embodiment, no contradiction occurs under processing. However, when line 3 is set as an implication start line and line10=1 is estimated, Gate 22 is detected as a gate to be influenced by line10=1. In this case, if a contradiction occurs, line10=X is set and the logical state of an implication start line is reversed (line3=1) in order to return the logical state of each signal line up to the point of time when the implication start line or line 3 is set.

Figure 9:
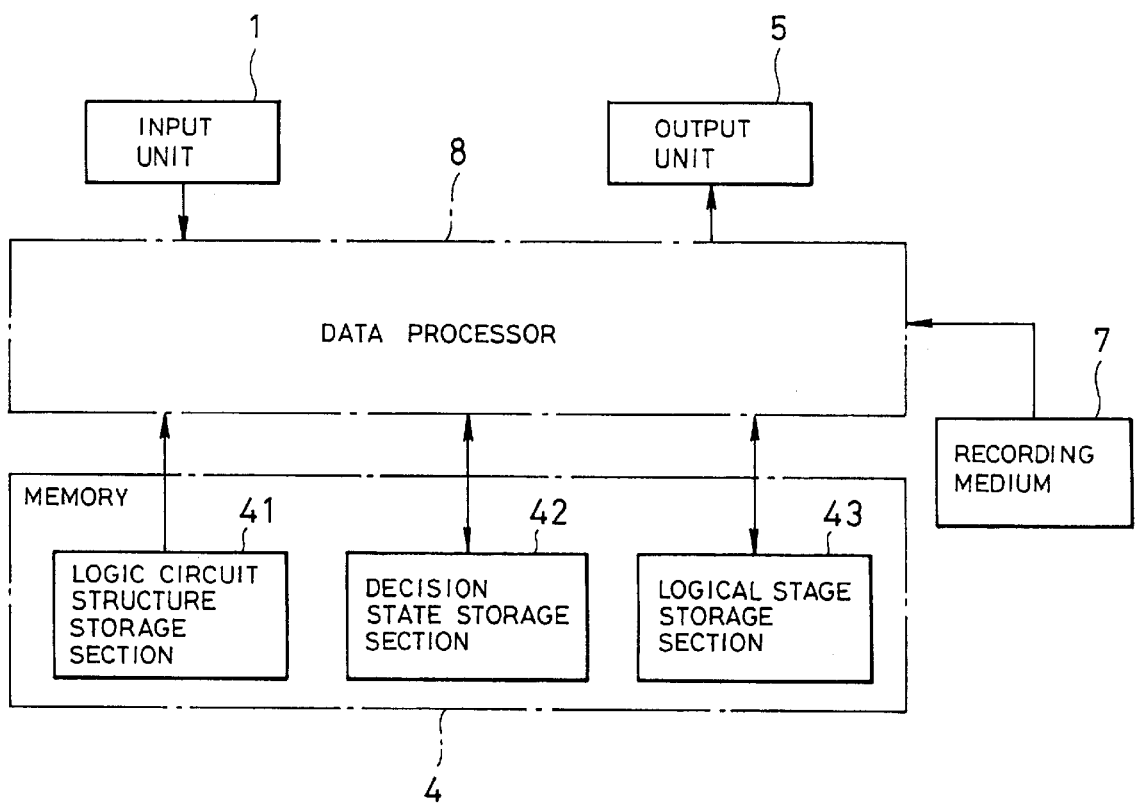
FIG. 9 is a block diagram showing the structure of the error propagation path extraction system of still another embodiment of the present invention.
Figure 10:
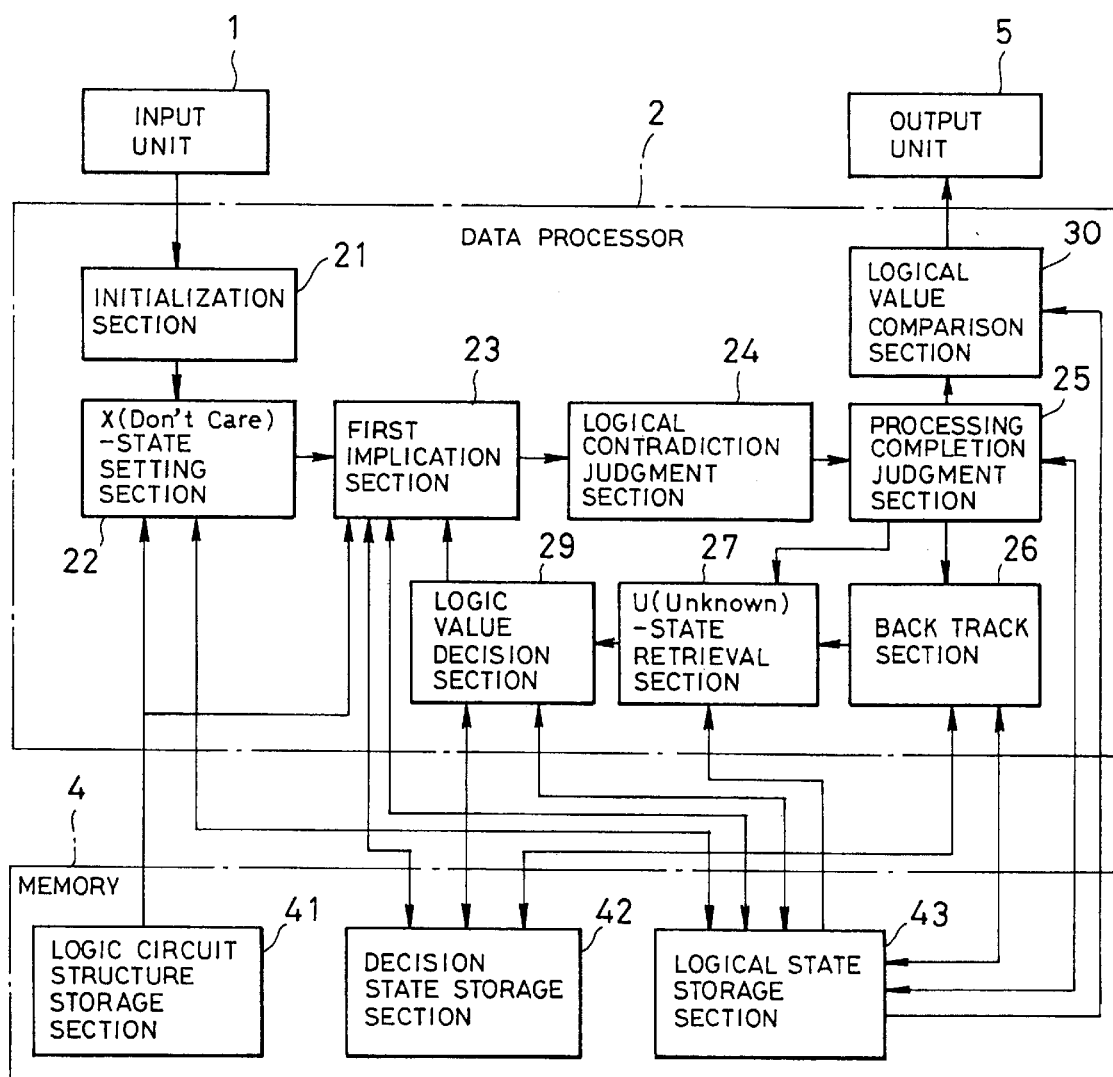
FIG. 10 is a block diagram showing the structure of the error propagation path extraction system of a conventional example.

FIG. 9 is a block diagram showing the structure of the error propagation path extraction system of still another embodiment of the present invention. In FIG. 9, the error propagation path extraction system of still another embodiment of the present invention has the same structure of the error propagation path extraction system of an embodiment of the present invention shown in FIG. 1 or the error propagation path extraction system of another embodiment of the present invention in FIG. 5 except that a recording medium 7 recording a error propagation path estimation program is used and the same component is provided with the same symbol.

The recording medium previously stores the error propagation path estimation program that is realized by a magnetic recording medium, semiconductor memory, or other recording medium. The error propagation path estimation program is read into a data processor 8 from the recording medium 7 to control operations of the data processor 8. The data processor 8 executes processing same as the following processing: the processing by the data processor 2 of the error propagation path extraction system of an embodiment of the present invention or the processing by the data processor 6 of another embodiment of the present invention.

When the logical state of the input/output terminal of a combinational circuit is supplied from the input unit 1, the data processor 8 refers to a circuit structure stored in the logic circuit structure storage section 41 and sets the logical state of a signal line not estimated yet to "X." By referring to the decision state storage section 42 and logical state storage section 43 and repeating decision and implication, the processor 8 estimates the logical state of every signal line.

After estimating the logical state of every signal line, the processor 8 extracts a error propagation path by comparing the logical state of each signal line stored in the logical state storage section with a normal logical value and moreover, makes the output unit 5 display only a error propagation path having a possibility of propagating an error to a failing output terminal.

Thus, when retrieving a signal line whose logical state is "U" and which is an object for decision, it is unnecessary to decide a logical value for a signal line not connected with a error propagation path by retrieving a signal line connected with a error propagation path with the error propagation path influenced line retrieval section 28, checking the physical relation a route and a failing output terminal in accordance with a error propagation path extracted by the error propagation path influenced line retrieval section 28 with the failing output terminal connection related line extraction section 31, and thereby extracting a signal line having a possibility of propagating a fault to the failing output terminal. therefore, the decision frequency, that is, the back-track frequency is decreased and it is possible to improve the computation speed for extraction of an error propagation path.

In this case, because data is output only to a route capable of propagating an error to a failing output terminal from the error propagation path extracted when the error propagation path is output, an unnecessary route having no possibility of propagating an error to the failing output terminal is not output and thereby, it is possible to decrease the amount of data to be output.

Moreover, because an error propagation path due to a fault in a combinational circuit is extracted, the second implication section 61 executes implication while confirming whether a contradiction occurs between the logical state estimated through implication and the logical state estimated by that point of time. Furthermore, by storing the data when a contradiction is detected under implication, it is possible to use a route capable obtained by the time when a logical contradiction occurs as a route capable of propagating an error to a failing output terminal when it is assumed that a fault is already present on the route. Therefore, it is possible to extract an error propagation path due to a fault in a combinational circuit.

Thereby, it is possible to obtain a high-speed error propagation path extraction algorithm or a inverse logical inference algorithm for outputting only an error propagation path having a possibility of propagating an error to a fault output and extract an error propagation path due to a fault in a combinational circuit.

In this case, it is theoretically possible to estimate an error propagation path without using physical analysis means and expect an effect on a future fined LSI having multilayer wiring.

As described above, an error propagation path extraction system of the present invention for estimating an error propagation path through the inverse logical inference system for estimating the logical state of the input terminal of a combinational logic circuit in accordance with the logical state of the output terminal of the circuit by using the back track system for estimating the logical state of every signal line by repeating implication and decision has an advantage that a high-speed error propagation path extraction algorithm and a inverse logical inference algorithm for outputting only an error propagation path having a possibility of propagating an error to an fault output can be gained by retrieving a signal line whose logical state is an object to be decided and a signal line connected with an error propagation path and extracting a signal line having a possibility of propagating an error to a failing output terminal from the error propagation path in accordance with the retrieval result by error propagation path influenced line retrieval means.

Moreover, another error propagation path extraction system of the present invention has an advantage that it is possible to extract an error propagation path due to a fault in a combinational circuit by executing implication while confirming whether a contradiction occurs between the logical state estimated through implication and the logical state estimated by that point of time.

What is claimed is:

1. An error propagation path extraction system for extracting an error propagation path through an inverse logical inference system for estimating the logical state of the input terminal of a combinational circuit in accordance with the logical state of the output terminal of the circuit by using a back track system for estimating the logical state of every signal line by repeating the implication for estimating the logical state of the input/output line of a gate not estimated yet in accordance with the logical state of the input/output line of a gate already estimated; the system comprising:

error propagation path influenced line retrieval means for retrieving a signal line connected with said error propagation path as said signal line whose logical state is an object to be decided; and failing output terminal connection related line extraction means for extracting a signal line having a possibility of propagating an error to a failing output terminal from said error propagation path in accordance with the retrieval result by said error propagation path influenced line retrieval means.

2. The error propagation path extraction system according to claim 1, wherein said error propagation path influenced line retrieval means is constituted so as to retrieve a signal line connected with said error propagation path when retrieving a signal line whose logical state is indeterminate and which is an object to be decided.

3. The error propagation path extraction system according to claim 1, wherein said failing output terminal connection related line extraction means is constituted so as to extract a signal line having a possibility of propagating an error to a failing output terminal by checking the physical relation between an extracted error propagation path and a failing output terminal in accordance with the route.

4. The error propagation path extraction system according to claim 1, wherein implication means for executing said implication while confirming whether a contradiction occurs between the logical state estimated through said implication and the logical state estimated by that point of time.

5. An error propagation path extraction method for extracting an error propagation path through an inverse logical inference system for estimating the logical state of the input terminal of a combinational circuit in accordance with the logical state of the output terminal of the circuit by using the back track system for estimating the logical state of every signal line by repeating the implication for estimating the logical state of the input/output line of a gate not estimated yet in accordance with the logical state of the input/output line of a gate already estimated, the method comprising the steps of:

retrieving a signal line connected with said error propagation path as said signal line whose logical state is an object to be decided; and extracting a signal line having a possibility of propagating an error to a failing output terminal from said error propagation path in accordance with the retrieval result by said error propagation path influenced line retrieval means.

6. The error propagation path extraction method according to claim 5, wherein the step of retrieving a signal line connected with said error propagation path retrieves a signal line connected with said error propagation path when retrieving a signal line whose logical state is indeterminate and which is an object to be decided.

7. The error propagation path extraction method according to claim 5, wherein the step of extracting a signal line having a possibility of propagating an error to a failing output terminal from said error propagation path extracts a signal line having a possibility of propagating an error to said failing output terminal by checking the physical connective relation between an extracted fault output route and said failing output terminal in accordance with the route.

8. The error propagation path extraction method according to claim 5, wherein the step of executing said implication while confirming whether a contradiction occurs between the logical state estimated through said implication and the logical state estimated by that point of time is included.

9. A recording medium adapted to record an error propagation path extraction control program for extracting an error propagation path with the inverse logical inference system for estimating the logical state of the input terminal of a combinational circuit in accordance with the logical state of the output terminal of the circuit by using a back track system for estimating the logical state of every signal line by repeating the implication for estimating the logical state of the input/output line of a gate not estimated yet in accordance with the logical state of the input/output line of a gate already estimated and the logical state decision, wherein said error propagation path extraction control program makes control means for controlling extraction of said error propagation path retrieve a signal line connected with said error propagation path as said signal line whose logical state is an object to be decided and extract a signal line having a possibility of propagating an error to a failing output terminal from said error propagation path in accordance with the retrieval result by an error propagation path influence line retrieval means.

10. The recording medium adapted to record an error propagation path extraction control program according to claim 9, wherein said error propagation path extraction control program makes said control means retrieve a signal line connected with said error propagation path when retrieving a signal line whose logical state is indeterminate and which is an object to be decided.

11. The recording medium adapted to record an error propagation path extraction control program according to claim 9, wherein said error propagation path extraction control program makes said control means extract a signal line having a possibility of propagating an error to a failing output terminal by checking the physical connective relation between an extracted fault output route and said failing output terminal in accordance with the route.

12. The recording medium adapted to record an error propagation path extraction control program according to claim 9, wherein said error propagation path extraction control program makes said control means execute said implication while confirming whether a contradiction occurs between the logical state estimated through said implication and the logical state estimated by the point of time.

* * * * *